(12) United States Patent
Wang et al.

(10) Patent No.: US 12,094,564 B2
(45) Date of Patent: Sep. 17, 2024

(54) MEMORY DEVICE AND COMPUTING METHOD THEREOF

(71) Applicant: MACRONIX INTERNATIONAL CO., LTD., Hsinchu (TW)

(72) Inventors: Yun-Yuan Wang, Kaohsiung (TW); Cheng-Hsien Lu, Taoyuan (TW); Dai-Ying Lee, Hukou Township (TW); Ming-Hsiu Lee, Hsinchu (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 145 days.

(21) Appl. No.: 17/817,701

(22) Filed: Aug. 5, 2022

(65) Prior Publication Data

US 2024/0046970 A1 Feb. 8, 2024

(51) Int. Cl.
*G11C 7/10* (2006.01)
(52) U.S. Cl.
CPC .......... *G11C 7/1063* (2013.01); *G11C 7/1006* (2013.01); *G11C 7/109* (2013.01)
(58) Field of Classification Search
CPC ................ G11C 7/10; G11C 7/1063
USPC ........................................................ 365/191
See application file for complete search history.

(56) References Cited

U.S. PATENT DOCUMENTS 10,528,862 B1 * 1/2020 Lin .................. H10B 41/35
2011/0255324 A1 10/2011 Lee
2019/0147919 A1 5/2019 Liaw
2020/0301667 A1 * 9/2020 Hung ................ G11C 16/0416
2022/0189968 A1 6/2022 Park et al.
2022/0216239 A1 7/2022 Yoo et al.

FOREIGN PATENT DOCUMENTS

| CN | 114639677 A | 6/2022 |
|---|---|---|
| TW | 201703235 A | 1/2017 |
| TW | 202230630 A | 8/2022 |

OTHER PUBLICATIONS

Abbush, R., et al.; "Construction o fEnergy Functions for Lattice Heteropolymer Models:A Case Study in Constraint Satisfaction Programming and Adiabatic Quantum Optimization;"Jun. 2013;pp. 1-44.*
Babbush, R., et al.; "Construction of Energy Functions for Lattice Heteropolymer Models: A Case Study in Constraint Satisfaction Programming and Adiabatic Quantum Optimization;" Jun. 2013; pp. 1-44.

* cited by examiner

*Primary Examiner* — Muna A Techane
(74) *Attorney, Agent, or Firm* — McClure, Qualey & Rodack, LLP

(57) ABSTRACT

The application provides a memory device and an operation method thereof. The memory device includes: a memory array, for processing model computation having a plurality of input values and a plurality of interact coefficients; and at least one calculation unit. In receiving the input values, a first part and a second part of the memory cells generate a first part and a second part of the common source currents, respectively. The first part of the memory cells is electrically isolated from the second part of the memory cells based on a diagonal of the memory array. The at least one calculation unit calculates a first part and a second part of a local field energy of the model computation based on the first part and the second part of the common source currents.

10 Claims, 18 Drawing Sheets

MEMORY DEVICE AND COMPUTING METHOD THEREOF

TECHNICAL FIELD

The present disclosure relates to a semiconductor device and a computing method performed by the semiconductor device, and more particularly, relates to a memory device and a computing method for processing a model computation using the memory device.

BACKGROUND

In recent days as technology progresses significantly, daily life is closely related to big data, and models can be constructed based on various parameters with big data. Furthermore, model computations can be used to provide solutions for target problems.

On the other hand, in the field of electronics or semiconductor technology, model computations are often used to adjust process parameters or condition factors of electronic devices or semiconductor components. However, complex electronic devices or semiconductor components involve a large number of parameters or factors and therefore need to perform complex model computations, which may result in time-consuming, energy-consuming or hardware cost-consuming for such model computations.

For example, an Ising model with multiple spin states may be used to perform an anneal computation. The Ising model may be applied to the traveling salesman problem (TSP) to obtain an optimal solution with the minimum travel distance. When the temperature of the anneal computation of the Ising model decreases and reaches the minimum energy value of the Ising model, the optimal solution of the configuration of the spin states may be obtained.

For a fully-connected Ising model, the anneal computation of the Ising model may be performed in a parallel manner, which may more quickly reach the minimum energy value of the Ising model. During the anneal computation, the spin state needs to be updated. However, when the dimension of the Ising model is larger and has a larger amount of spin states, it takes a lot of computing resources and a long computing time. Furthermore, defects in the hardware device executing the Ising model also lead to computational errors in the anneal computation.

Therefore, any skilled person of related industries in this technical field is dedicated to technical solutions to more efficiently perform model computations to improve the Ising model execution speed.

SUMMARY

According to one embodiment, a memory device is provided. The memory device includes: a memory array, for processing model computation having a plurality of input values and a plurality of interact coefficients; and at least one calculation unit, coupled to the at least one memory sub-array. The memory array includes at least one memory sub-array, the at least one memory sub-array including: a plurality of memory cells, a plurality of first signal lines, a plurality of second signal lines and a plurality of third signal lines coupled to the memory cells. The memory cells receive the input values via the second signal lines and the third signal lines, the memory cells generate a plurality of source currents, the source currents flowing through the first signal lines to generate a plurality of common source currents, the common source currents flowing into the at least one calculation unit, a first part of the memory cells generate a first part of the common source currents, a second part of the memory cells generate a second part of the common source currents. The first part of the memory cells store a plurality of first part coefficients of the interact coefficients, and the second part of the memory cells store a plurality of second part coefficients of the interact coefficients, wherein the first part of the memory cells is electrically isolated from the second part of the memory cells based on a diagonal of the memory array. The at least one calculation unit calculates a first part of a local field energy of the model computation based on the first part of the common source currents, and calculates a second part of the local field energy of the model computation based on the second part of the common source currents.

According to another embodiment, an operation method for a memory device is provided. The operation method for a memory device is for processing a model computation, the model computation having a plurality of input values and a plurality of interact coefficients. The operation method includes: storing a plurality of first part coefficients of the interact coefficients in a first part of a plurality of memory cells of at least one memory sub-array of a memory array of the memory device, storing a plurality of second part coefficients of the interact coefficients in a second part of the plurality of memory cells of at least one memory sub-array of the memory device, wherein the first part of the memory cells is electrically isolated from the second part of the memory cells based on a diagonal of the memory array; inputting the input values into the memory cells, the memory cells generate a plurality of source currents, the source currents flowing through a plurality of first signal lines of the memory device to generate a plurality of common source currents, the first part of the memory cells generate a first part of the common source currents, the second part of the memory cells generate a second part of the common source currents; and calculating a first part of a local field energy of the model computation based on the first part of the common source currents, and calculating a second part of the local field energy of the model computation based on the second part of the common source currents.

Figure 1A:
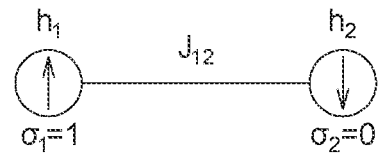
FIGS. 1A and 1B illustrate schematic diagrams of an Ising model with input-values.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 1B:
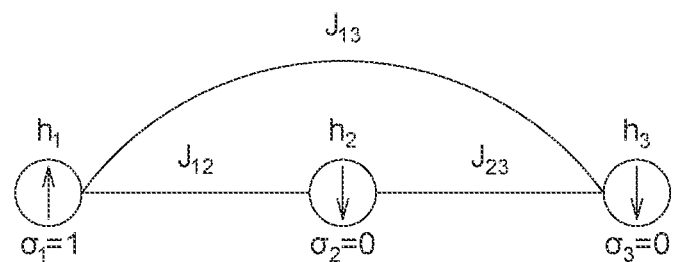

FIGS. 1A and 1B illustrate schematic diagrams of an Ising model with input-values. Please refer to FIG. 1A, the Ising model has two input-values $\sigma_1$ and $\sigma_2$, where the first input-value $\sigma_1$ is the first spin state of the Ising model, and the second input-value $\sigma_2$ is the second spin state. The first input-value $\sigma_1$ is logic value "1", which means the spin state is "spin in a positive direction" (i.e., the upward arrow in FIG. 1A), and the second input-value $\sigma_2$ is logic value "0", which means the spin state is "spin in a reverse direction" (i.e., the downward arrow in FIG. 1A). The first input-value $\sigma_1$ has a self-coefficient $h_1$, the second input-value $\sigma_2$ has a self-coefficient $h_2$, and there is a mutual-coefficient (or interact coefficient) $J_{12}$ between the two input-values $\sigma_1$ and $\sigma_2$.

Furthermore, referring to FIG. 1B, taking an Ising model with three input-values $\sigma_1$, $\sigma_2$ and $\sigma_3$ as an example, the logic values of the input-values $\sigma_1$, $\sigma_2$ and $\sigma_3$ are, for example, "1, 0, 0". The input-values $\sigma_1$, $\sigma_2$ and $\sigma_3$ have self-coefficients $h_1$, $h_2$ and $h_3$ respectively. And, the input-values $\sigma_1$ and $\sigma_2$ have mutual-coefficient $J_{12}$, the input-values $\sigma_1$ and $\sigma_3$ have mutual-coefficient $J_{13}$, and the input-values $\sigma_2$ and $\sigma_3$ have mutual-coefficient $J_{23}$.

Figure 2A:
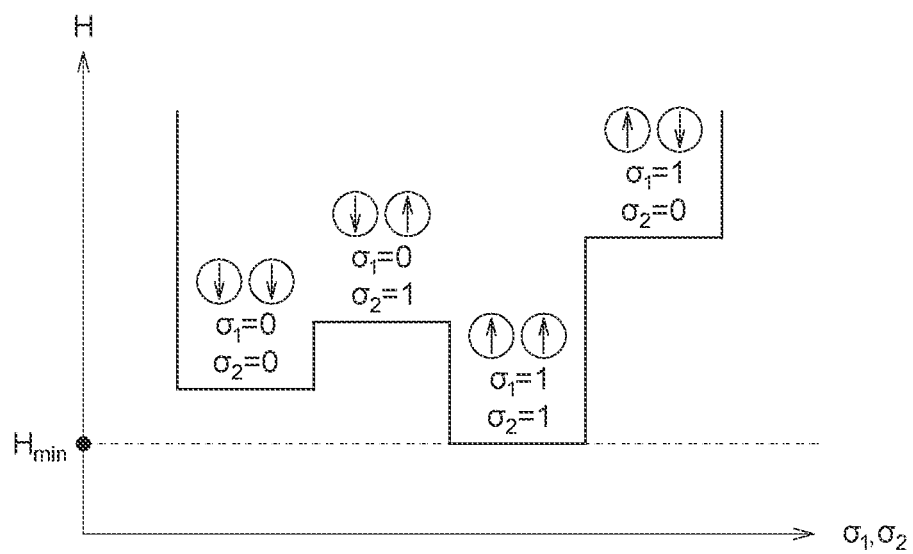
FIG. 2A illustrates a schematic diagram of computing energy using the Ising model.

FIG. 2A illustrates a schematic diagram of computing energy using the Ising model. Please refer to FIG. 2A, the Ising model can be used to compute the cost function and locate the minimum value of the cost function. For example, the Ising model uses the energy H of a specific material (such as a magnetic material) as a cost function and locates the lowest energy $H_{min}$. Take the Ising model with two input-values $\sigma_1$ and $\sigma_2$ in FIG. 1A as an example, according to the Ising model computation illustrated in equation (1), the input-values $\sigma_1$ and $\sigma_2$ of different logic values can be computed which correspond to different values of energy H:

$$H = \Sigma_{i=1\sim2} h_i \sigma_i + \Sigma_{i<j} J_{ij}(\sigma_i * \sigma_j) \qquad (1)$$

$$= h_1 \sigma_1 + h_2 \sigma_2 + J_{12}(\sigma_1 * \sigma_2)$$

The operator symbol of "*" in equation (1) represents a logic XNOR operation. If the input-values σi and σj have the same logic value (for example, "1, 1" or "0, 0"), the result of the logic XNOR operation is "1". If the input-values σi and σj have different logic values (for example, "1, 0" or "0, 1"), the result of the logic XNOR operation is "0". In the embodiment illustrated in FIG. 2A, the computation according to equation (1) can locate the material has the lowest energy $H_{min}$ when the input-values $\sigma_1$ and $\sigma_2$ are logic values "1, 1". Similarly, if the Ising model has three input-values $\sigma_1$, $\sigma_2$ and $\sigma_3$, the energy H can be computed according to the Ising model of equation (2):

$$H = h_1\sigma_1 + h_2\sigma_2 + h_3\sigma_3 + J_{12}(\sigma_1*\sigma_2) + J_{13}(\sigma_1*\sigma_3) + J_{23}(\sigma_2*\sigma_3) \qquad (2)$$

Figure 2B:
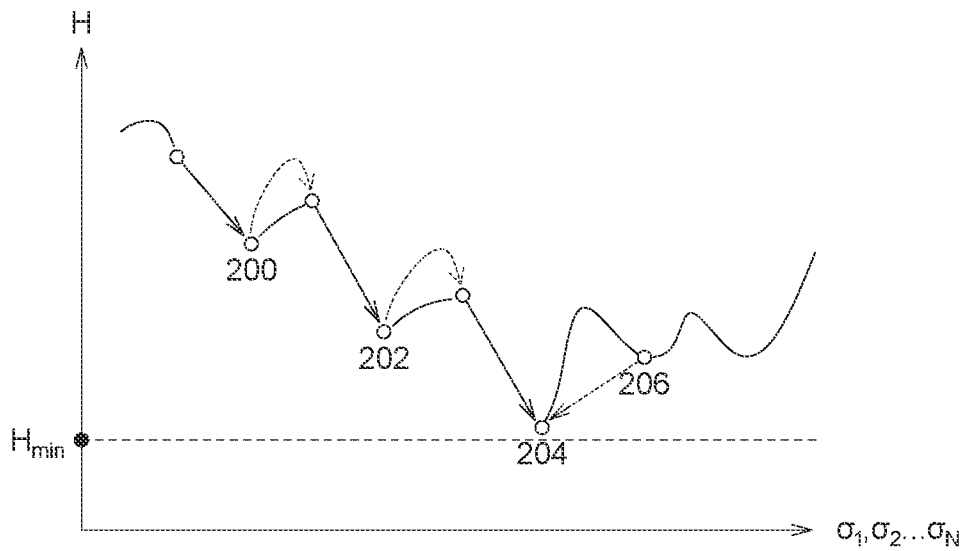
FIG. 2B illustrates a schematic diagram of simulating quantum annealing using the Ising model.

FIG. 2B illustrates a schematic diagram of simulating quantum annealing using the Ising model. Please refer to FIG. 2B, the computing device (for example: complementary metal oxide semiconductor (CMOS) semiconductor device) can perform computation of the Ising model to simulate quantum annealing so as to locate the minimum value (i.e., the lowest energy $H_{min}$) of the cost function (i.e., energy H). The Ising model computation of the embodiment in FIG. 2B has, for example, N input-values $\sigma_1, \sigma_2, \ldots, \sigma_N$, and the input-values $\sigma_1, \sigma_2, \ldots, \sigma_N$ of different logic values correspond to different configurations 200, 202, 204 and 206, etc. Configuration 200 indicates that the input-values $\sigma_1, \sigma_2, \ldots, \sigma_N$ are logic values "0, 1, . . . , 1", and configuration 204 indicates that the input-values $\sigma_1, \sigma_2, \ldots, \sigma_N$ are logic values "1, 1, . . . , 0", etc. The moving path of the Ising model computation refers to the following: moving from configuration 200 to configuration 202 and then to configuration 204, and then locating configuration 204 with the lowest energy $H_{min}$. On the other hand, the quantum annealing computation moves from configuration 206 to configuration 204 so as to locate the lowest energy Hmm. From the above, the result of the computing device performing the Ising model computation is the same as the result of the quantum annealing computation.

The energy difference ΔH of the Ising model is expressed as the equation (3):

$$\Delta H = H(-\sigma_i) - H(\sigma_i) \qquad (3)$$

The energy difference ΔH of the second order and the third order of the Ising model are expressed as the equations (4-1) and (4-2):

$$H = -\sum_i J_i^{(1)}\sigma_i - \sum_{i<j} J_{ij}^{(2)}\sigma_i\sigma_j \Rightarrow \Delta H = 2\sigma_i\left(J_i^{(1)} + \sum_{j \neq i} J_{ij}^{(2)}\sigma_j\right) \qquad (4-1)$$

$$H = -\Sigma_i J_i^{(1)}\sigma_i - \Sigma_{i<j} J_{ij}^{(2)}\sigma_i\sigma_j - \Sigma_{i<j<k} J_{ijk}^{(3)}\sigma_i\sigma_j\sigma_k \Rightarrow \Delta H = \qquad (4-2)$$

$$2\sigma_i\left(J_i^{(1)} + \Sigma_{j \neq i}J_{ij}^{(2)}\sigma_j + \Sigma_{\substack{j,k \neq i \\ j<k}}J_{ijk}^{(3)}\sigma_i\sigma_j\right)$$

In the equations (4-1) and (4-2), the energy difference is related to the input value σ and the local field energy.

For example, in the equation (4-1), the first order local field energy $L_i^{(1)}$ and the second order local field energy $L_i^{(2)}$ are expressed as the equations (5-1) and (5-2):

$$L_i^{(1)} = J_i^{(1)} \tag{5-1}$$

$$L_i^{(2)} = \Sigma_{j \neq i} J_{ij}^{(2)} \sigma_j \tag{5-2}$$

In the equation (4-2), the first order local field energy $L_i^{(1)}$, the second order local field energy $L_i^{(2)}$ and the third order local field energy $L_i^{(3)}$ are expressed as the equations (6-1), (6-2) and (6-3):

$$L_i^{(1)} = J_i^{(1)} \tag{6-1}$$

$$L_i^{(2)} = \sum_{j \neq i} J_{ij}^{(2)} \sigma_j \tag{6-2}$$

$$L_i^{(3)} = \sum_{\substack{j, k \neq i \\ j < k}} J_{ijk}^{(3)} \sigma_i \sigma_j \tag{6-3}$$

After the local field energy is calculated, the local field energy may be used in determining whether to flip the spin status (i.e. to spin the input value) or in determining whether to update the spin status (i.e. to update the input value), for generating the optimum solution.

One embodiment of the application discloses a semiconductor memory device to calculate the local field energy for processing the Ising model computation.

Figure 3:
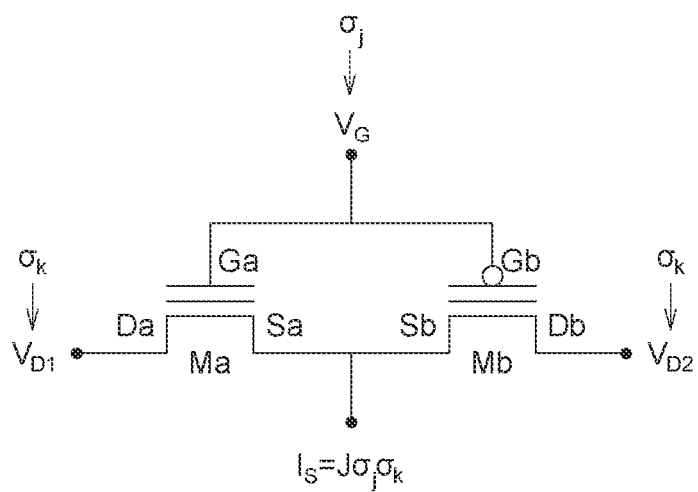
FIG. 3 shows a circuit diagram of a memory cell according to one embodiment of the application.

FIG. 3 shows a circuit diagram of a memory cell 30 according to one embodiment of the application. The memory cell 30 includes a first transistor Ma and a second transistor Mb. For example but not limited by, the first transistor Ma is an N-type transistor and the second transistor Mb is a P-type transistor.

The first transistor Ma includes a first gate Ga for receiving a gate voltage $V_G$, a first drain Da for receiving a first drain voltage $V_{D1}$ and a first source Sa. The second transistor Mb includes a second gate Gb for receiving the gate voltage $V_G$, a second drain Db for receiving a second drain voltage $V_{D2}$ and a second source Sb. The first source Sa of the first transistor Ma are coupled to the second source Sb of the second transistor Mb by common source coupling.

In logic computation, the gate voltage V G is corresponding to the input value $\sigma_j$ of the Ising model, wherein "j" refers to the j-th input value $\sigma_j$ (i.e. the j-th spin status of the Ising model). When the input value $\sigma_j$ is logic "+1", the gate voltage $V_G$ is a first gate voltage $V_{GN}$ for conducting the first transistor Ma; and when the input value $\sigma_j$ is logic "−1", the gate voltage $V_G$ is a second gate voltage $-V_{GP}$ for conducting the second transistor Mb.

Similarly, the first drain voltage $V_{D1}$ and the second drain voltage $V_{D2}$ are corresponding to the input value $\sigma_k$ wherein "k" refers to the k-th input value $\sigma_k$ (i.e. the k-th spin status of the Ising model). When the input value $\sigma_k$ is logic "+1", the first drain voltage $V_{D1}$ and the second drain voltage $V_{D2}$ are the voltages $+V_{DN}$ and $-V_{DP}$, respectively; and when the input value $\sigma_k$ is logic "−1", the first drain voltage $V_{D1}$ and the second drain voltage $V_{D2}$ are the voltages $-V_{DN}$ and $+V_{DP}$, respectively.

In logic computation, the source current $I_S$ of the memory cell 30 is expressed as: $I_S = J\sigma_j \sigma_k$.

Figure 4A:
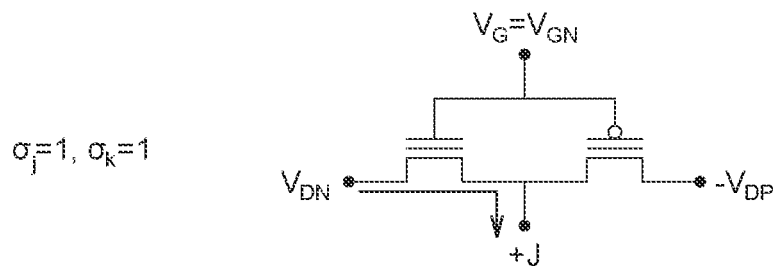
FIG. 4A to FIG. 4D show the operations of the memory cell according to one embodiment of the application.
Figure 4B:
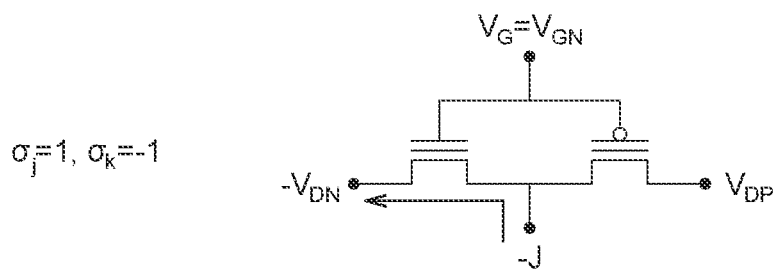
Figure 4C:
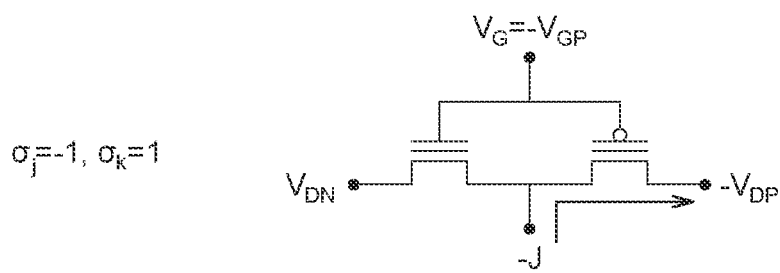
Figure 4D:
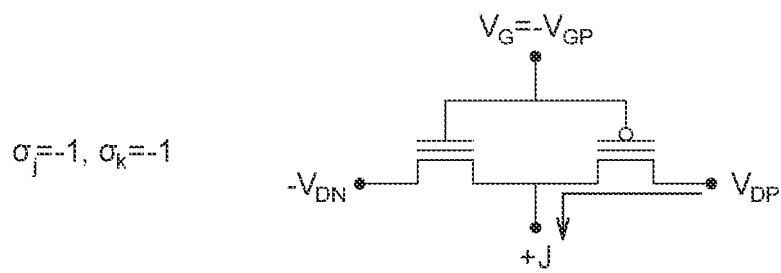

FIG. 4A to FIG. 4D show the operations of the memory cell 30 according to one embodiment of the application. As shown in FIG. 4A, when the input value $\sigma_j$ is logic "+1" and the input value $\sigma_k$ is logic "+1", the source current $I_S$ of the memory cell 30 is $I_S = J\sigma_j \sigma_k = +J$. As shown in FIG. 4B, when the input value $\sigma_j$ is logic "+1" and the input value $\sigma_k$ is logic "−1", the source current $I_S$ of the memory cell 30 is $I_S = J\sigma_j \sigma_k = -J$. As shown in FIG. 4C, when the input value $\sigma_j$ is logic "−1" and the input value $\sigma_k$ is logic "+1", the source current $I_S$ of the memory cell 30 is $I_S = J\sigma_j \sigma_k = -J$. As shown in FIG. 4D, when the input value $\sigma_j$ is logic "−1" and the input value $\sigma_k$ is logic "−1", the source current $I_S$ of the memory cell 30 is $I_S = J\sigma_j \sigma_k = +J$. The positive current has a current direction from the drain to the source, and the negative current has a current direction from the source to the drain.

In one embodiment of the application, when the input value $\sigma_k$ is fixed as logic "+1", the source current $I_S$ of the memory cell 30 is $I_S = J\sigma_j \sigma_k = J\sigma_j$, as shown in FIG. 4A and FIG. 4C.

In one embodiment of the application, when the input value $\sigma_j$ and the input value $\sigma_k$ have the same value, the source current $I_S$ of the memory cell 30 is $I_S = J\sigma_j \sigma_k = J$, as shown in FIG. 4A and FIG. 4D.

Thus, from FIG. 3 and FIG. 4A to FIG. 4D, the memory cell 30 may implement $I_S = J$, $I_S = J\sigma_j$ and $I_S = J\sigma_j \sigma_k$ (J being a constant value).

Figure 5:
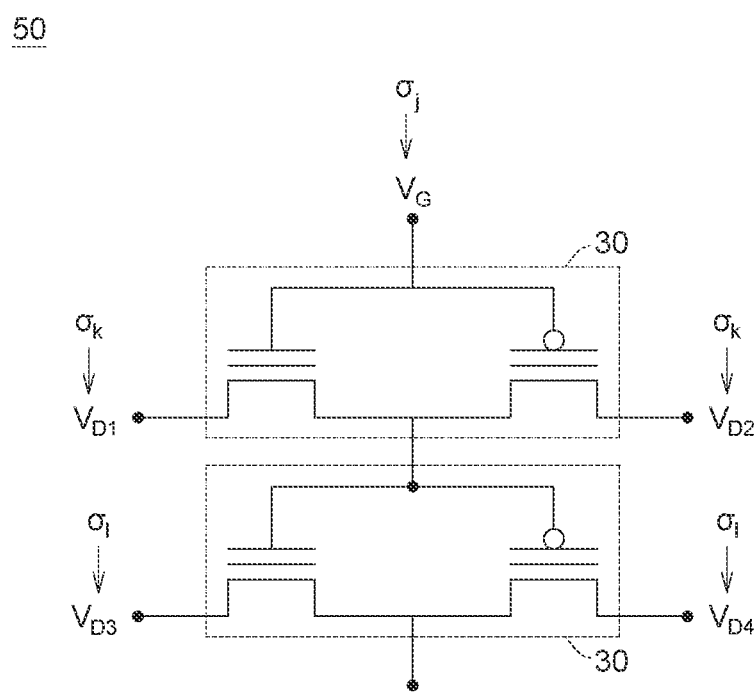
FIG. 5 shows a circuit diagram of a memory cell according to one embodiment of the application.

FIG. 5 shows a circuit diagram of a memory cell 50 according to one embodiment of the application. The memory cell 50 includes two cascaded memory cells 30. As shown in FIG. 5, the two drains of another memory cell 30 receive the third drain voltage $V_{D3}$ and the fourth drain voltage $V_{D4}$, respectively. The third drain voltage $V_{D3}$ and the fourth drain voltage $V_{D4}$ are corresponding to the input value $\sigma_l$, wherein "l" refers to the l-th input value $\sigma_k$ (i.e. the l-th spin status of the Ising model). When the input value $\sigma_l$ is logic "+1", the third drain voltage $V_{D3}$ and the fourth drain voltage $V_{D4}$ are the voltages $+V_{DN}$ and $-V_{DP}$; and when the input value $\sigma_l$ is logic "−1", the third drain voltage $V_{D3}$ and the fourth drain voltage $V_{D4}$ are the voltages $-V_{DN}$ and $+V_{DP}$. In logic computation, the source current $I_S$ of the memory cell 50 is expressed as: $I_S = J\sigma_j \sigma_k \sigma_l$. In cascading the memory cells 30, the common source of one of the memory cells 30 is coupled to the gate of another memory cell 30.

Figure 6A:
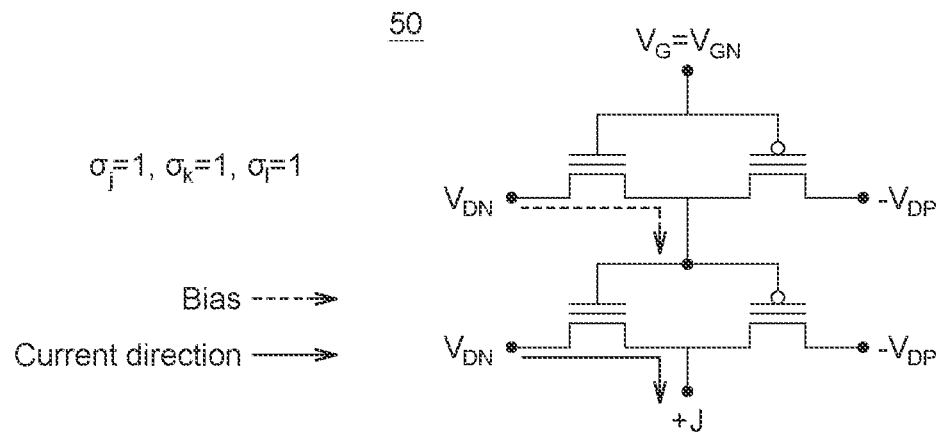
FIG. 6A to FIG. 6H show the operations of the memory cell according to one embodiment of the application.
Figure 6B:
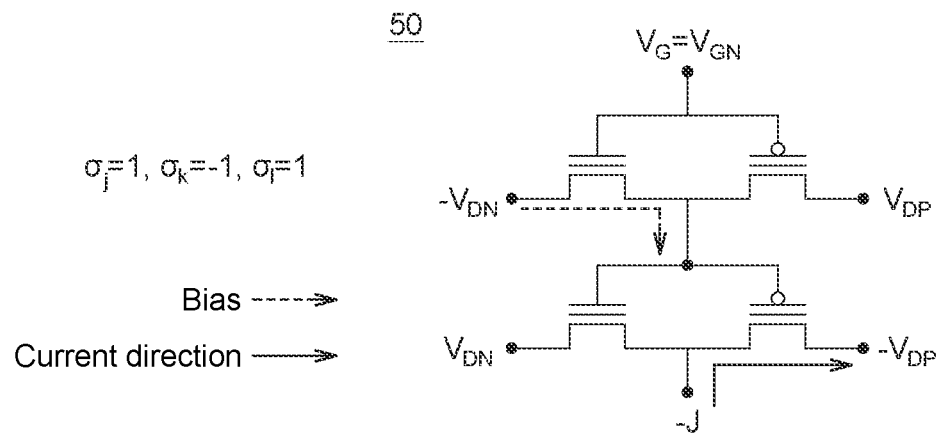
Figure 6C:
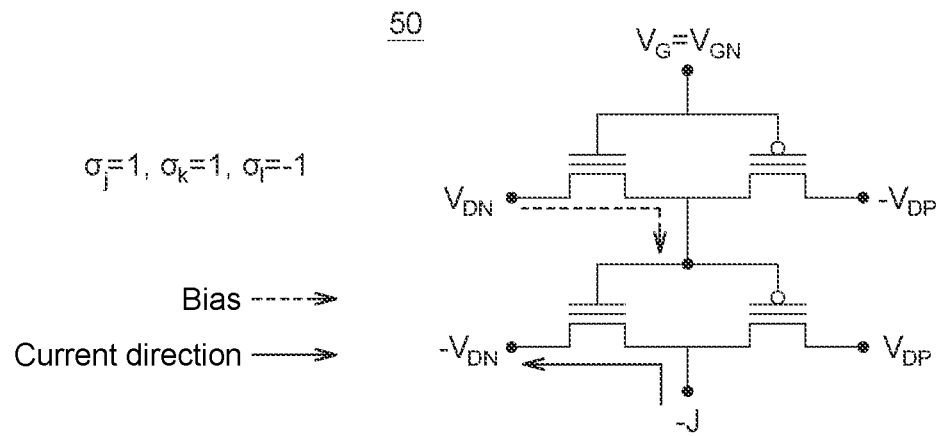
Figure 6D:
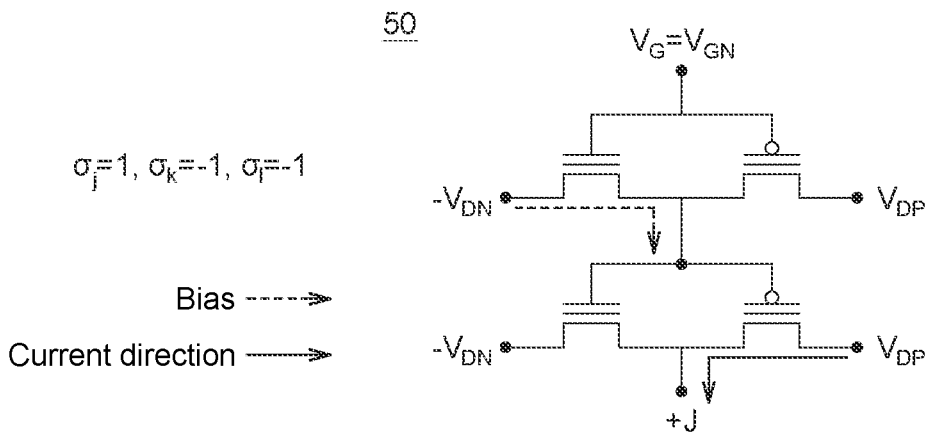
Figure 6E:
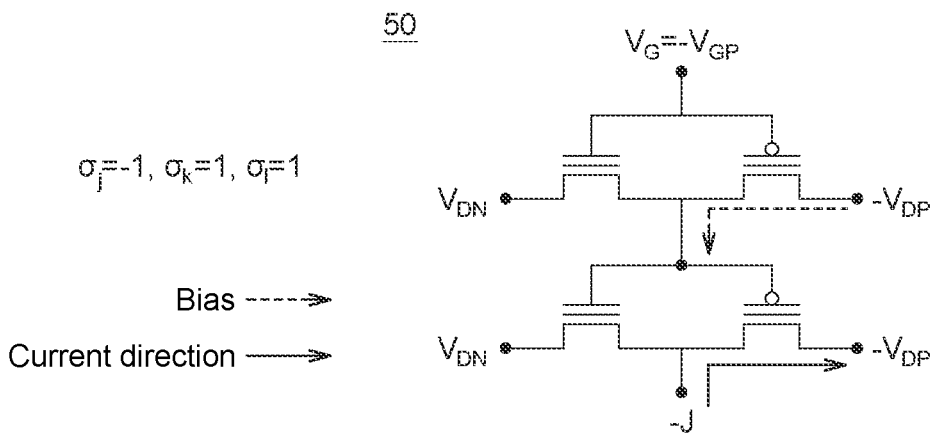
Figure 6F:
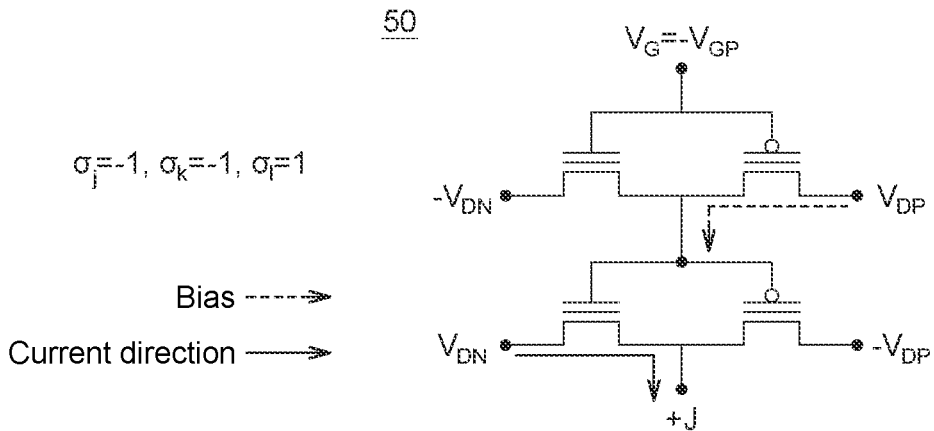
Figure 6G:
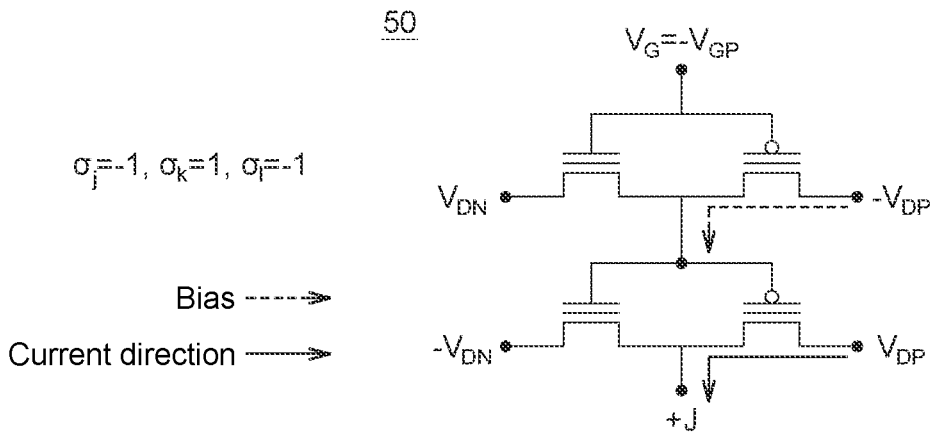
Figure 6H:
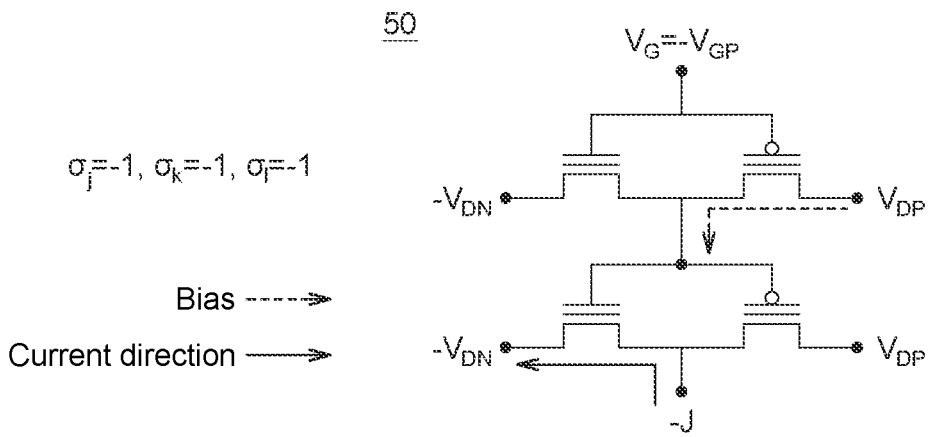

FIG. 6A to FIG. 6H show the operations of the memory cell 50 according to one embodiment of the application. As shown in FIG. 6A, when the input value $\sigma_j$ is logic "+1", the input value $\sigma_k$ is logic "+1" and the input value $\sigma_l$ is logic "+1", the source current $I_S$ of the memory cell 50 is $I_S = J\sigma_j \sigma_k \sigma_l = +J$. As shown in FIG. 6B, when the input value $\sigma_j$ is logic "+1", the input value $\sigma_k$ is logic "−1" and the input value $\sigma_l$ is logic "+1", the source current $I_S$ of the memory cell 50 is $I_S = J\sigma_j \sigma_k \sigma_l = -J$. As shown in FIG. 6C, when the input value $\sigma_j$ is logic "+1", the input value $\sigma_k$ is logic "+1" and the input value $\sigma_l$ is logic "−1", the source current $I_S$ of the memory cell 50 is $I_S = J\sigma_j \sigma_k \sigma_l = -J$. As shown in FIG. 6D, when the input value $\sigma_j$ is logic "+1", the input value $\sigma_k$ is logic "−1" and the input value $\sigma_l$ is logic "−1", the source current $I_S$ of the memory cell 50 is $I_S = J\sigma_j \sigma_k \sigma_l = +J$. As shown in FIG. 6E, when the input value $\sigma_j$ is logic "−1", the input value $\sigma_k$ is logic "+1" and the input value $\sigma_l$ is logic "+1", the source current $I_S$ of the memory cell 50 is $I_S = J\sigma_j \sigma_k \sigma_l = -J$. As shown in FIG. 6F, when the input value $\sigma_j$ is logic "−1", the input value $\sigma_k$ is logic "−1" and the input value $\sigma_l$ is logic "+1", the source current $I_S$ of the memory cell 50 is $I_S = J\sigma_j \sigma_k \sigma_l = +$. As shown in FIG. 6G, when the input value $\sigma_j$ is logic "−1", the input value $\sigma_k$ is logic "+1" and the input value $\sigma_l$ is logic "−1", the source current $I_S$ of the memory cell 50 is $I_S = J\sigma_j \sigma_k \sigma_l = +J$. As shown in FIG. 6H, when the input value $\sigma_j$ is logic "−1", the input value $\sigma_k$ is logic "−1" and the input value $\sigma_l$ is logic "−1", the source current $I_S$ of the memory cell 50 is $I_S = J\sigma_j \sigma_k \sigma_l = -J$.

Thus, from the above, in one embodiment of the application, by cascading more memory cells 30, the source current $I_S$ of the memory cell are corresponding to more input values.

In one embodiment of the application, the local field energy $L_i$ corresponding to the input value $\sigma_i$ is expressed as the equation (7):

$$L_i = J_i^{(1)} + \Sigma_j J_{ij}^{(2)} \sigma_j + \Sigma_{j<k} J_{ijk}^{(3)} \sigma_j \sigma_k + \Sigma_{j<k<l} J_{ijkl}^{(4)} \sigma_j \sigma_k \sigma_l + \ldots + \Sigma_{j<k<\ldots<r<s} J_{ijkl\ldots\alpha}^{(n)} \sigma_j \sigma_k \ldots \sigma_r \sigma_s \quad (7)$$

Figure 7:
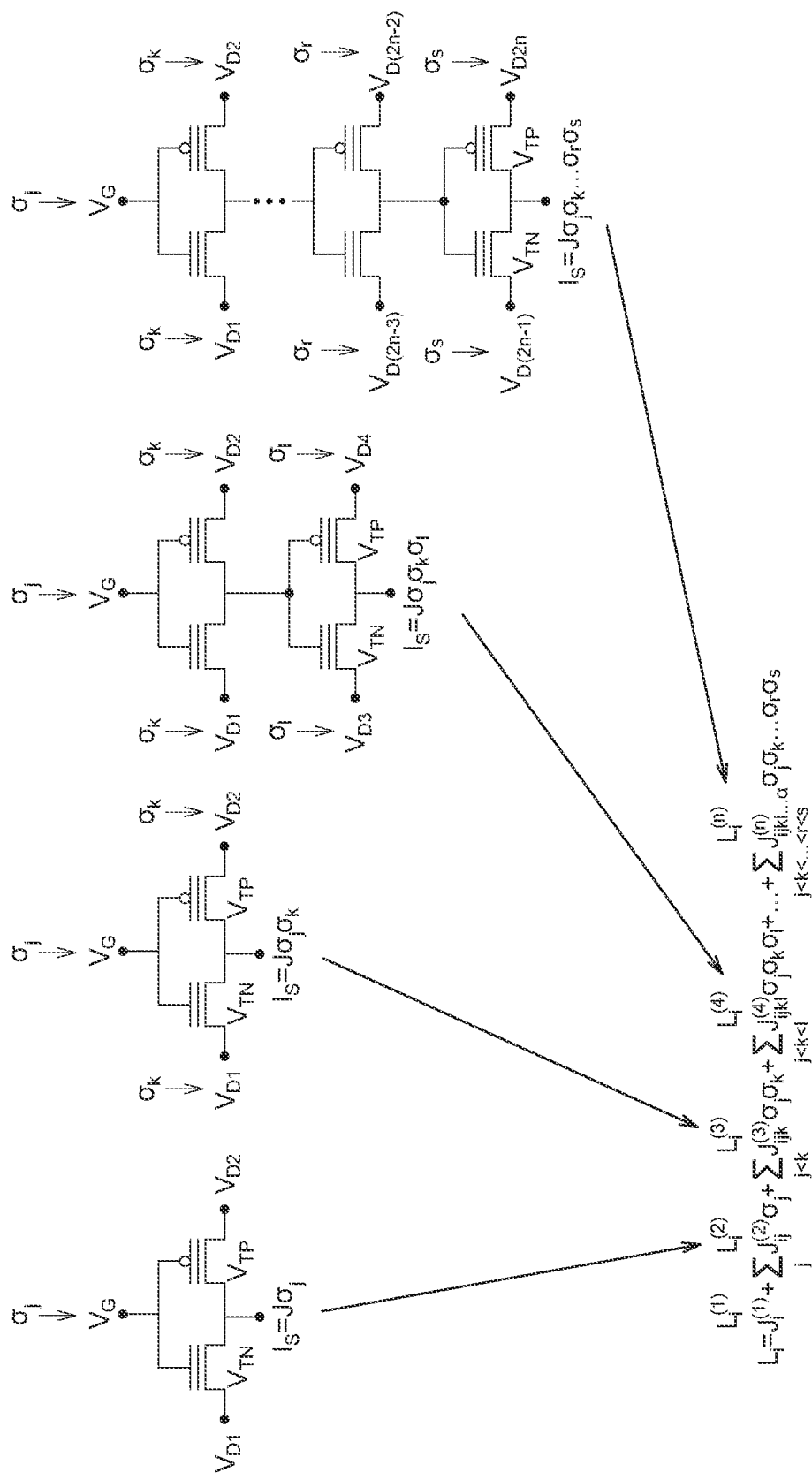
FIG. 7 shows calculation of the local field energy by the memory cell according to one embodiment of the application.

FIG. 7 shows calculation of the local field energy $L_i$ by the memory cell 30 according to one embodiment of the application. As shown in FIG. 4A and FIG. 4B, the constant value $J_i^{(1)}$ is calculated by the single order memory cell 30. As shown in FIG. 4A and FIG. 4B, the first order local field energy $L_i^{(1)}$ is calculated by the single order memory cell 30. As shown in FIG. 4A and FIG. 4B, the second local field energy $L_i^{(2)}$ is calculated by the single order memory cell 30. Similarly, as shown in FIG. 5, the third order local field energy $L_i^{(3)}$ is calculated by cascading two memory cells 30. By so, higher order local field energy $L_i^{(n)}$ is calculated by cascading more memory cells 30. As shown in FIG. 7, the input value $\sigma_r$ is corresponding to the drain voltage $V_{D(2n-3)}$ and the drain voltage $V_{D(2n-2)}$, and the input value $\sigma_s$ is corresponding to the drain voltage $V_{D(2n-1)}$ and the drain voltage $V_{D2n}$.

Figure 8A:
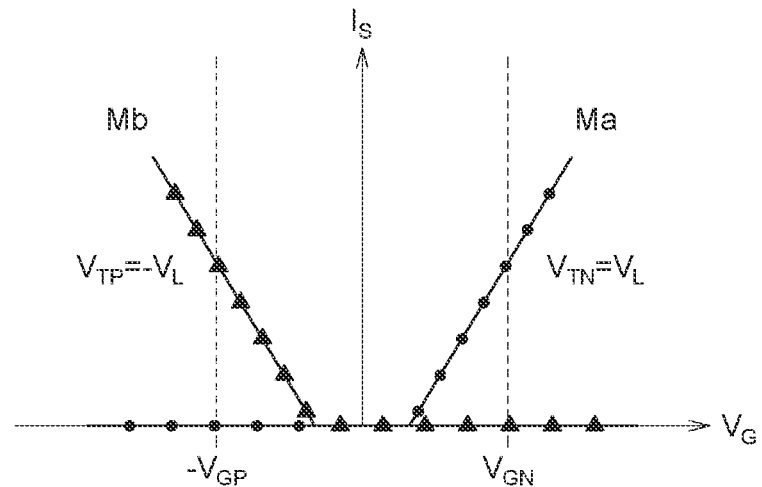
FIG. 8A and FIG. 8B show determination of the coefficient according to one embodiment of the application.
Figure 8B:
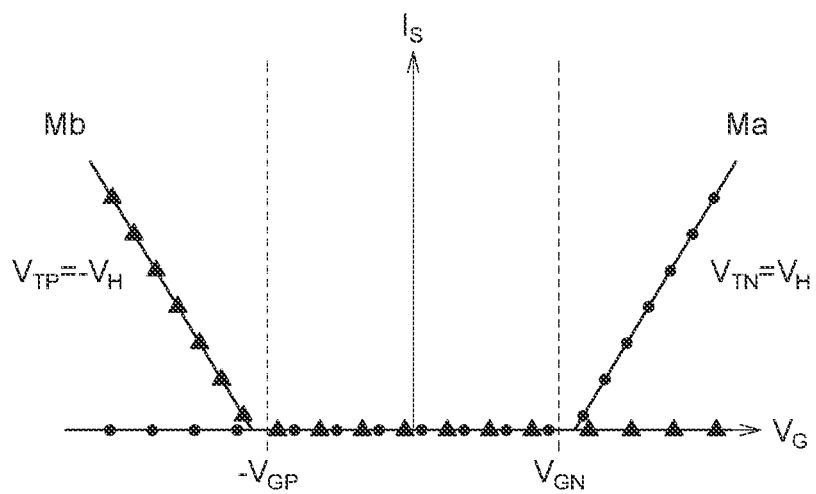

Determination of the coefficient J according to one embodiment of the application is described. FIG. 8A and FIG. 8B show determination of the coefficient J according to one embodiment of the application. In one embodiment of the application, by adjusting threshold voltages of the first transistor Ma and the second transistor Mb, the coefficient J is determined.

As shown in FIG. 8A, when the threshold voltage $V_{TN}$ of the N type transistor (for example, the first transistor Ma) and the threshold voltage $V_{TP}$ of the P type transistor (for example, the second transistor Mb) are the reference threshold voltages $V_L$ and $-V_L$, the coefficient J is 1. When the gate voltage $V_G=V_{GN}$, the N type transistor (for example, the first transistor Ma) is conducted while the P type transistor (for example, the second transistor Mb) is turned off. When the gate voltage $V_G=-V_{GP}$, the N type transistor (for example, the first transistor Ma) is turned off while the P type transistor (for example, the second transistor Mb) is conducted.

As shown in FIG. 8B, when the threshold voltage $V_{TN}$ of the N type transistor (for example, the first transistor Ma) and the threshold voltage $V_{TP}$ of the P type transistor (for example, the second transistor Mb) are the reference threshold voltages $V_H$ and $-V_H$, the coefficient J is 0 wherein $V_H > V_L$. When the gate voltage $V_G=V_{GN}$, both the N type transistor (for example, the first transistor Ma) and the P type transistor (for example, the second transistor Mb) are turned off. When the gate voltage $V_G=-V_{GP}$, both the N type transistor (for example, the first transistor Ma) and the P type transistor (for example, the second transistor Mb) are turned off.

FIG. 8A and FIG. 8B show when the coefficient J has two levels, which is not to limit the application. In other possible embodiment of the application, by fine tuning the threshold voltages of the N type transistor and/or the P type transistor, the coefficient J has more levels or the coefficient J may be analog.

Figure 9A:
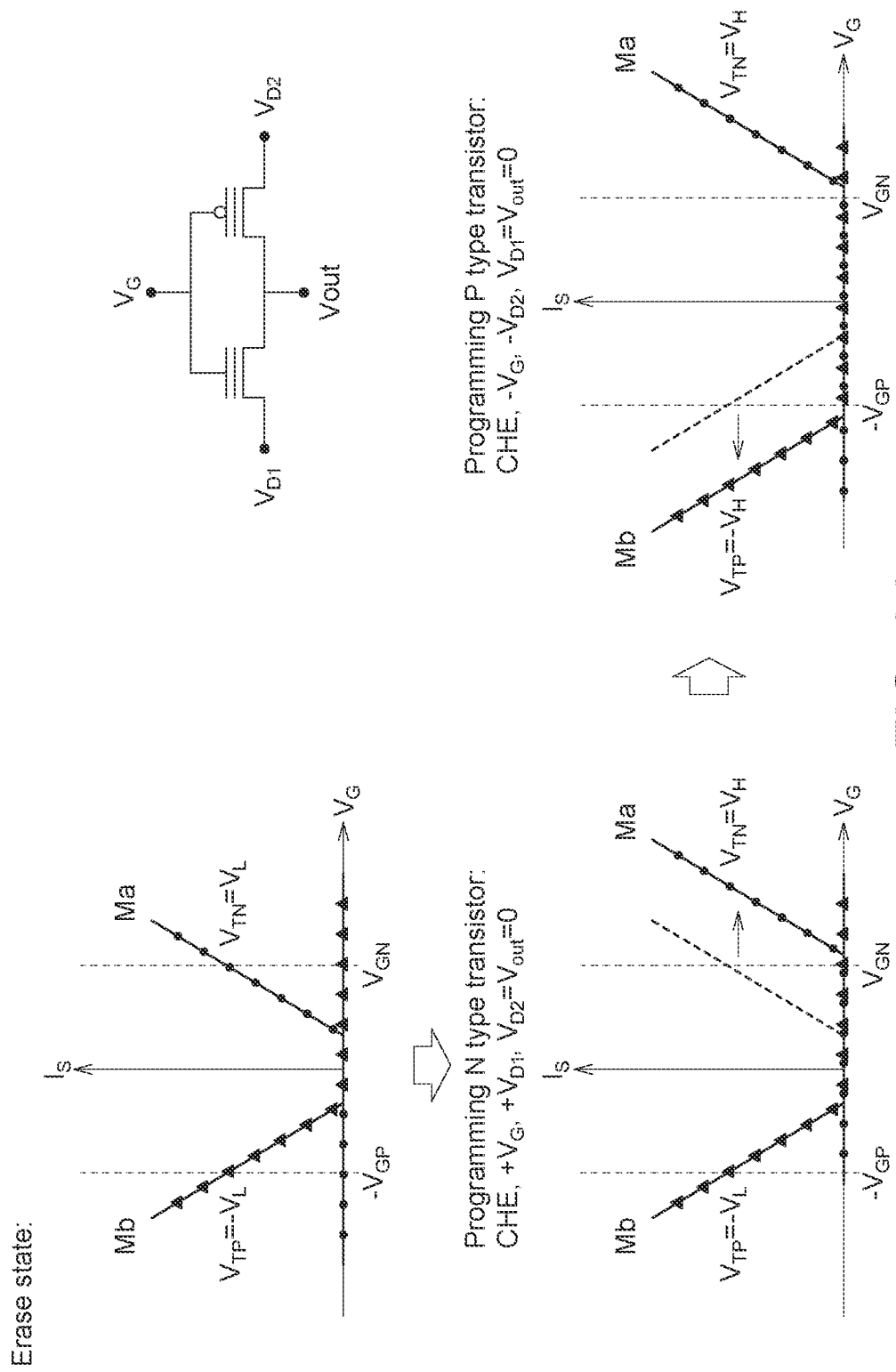
FIG. 9A shows the programming operations according to one embodiment of the application.
Figure 9B:
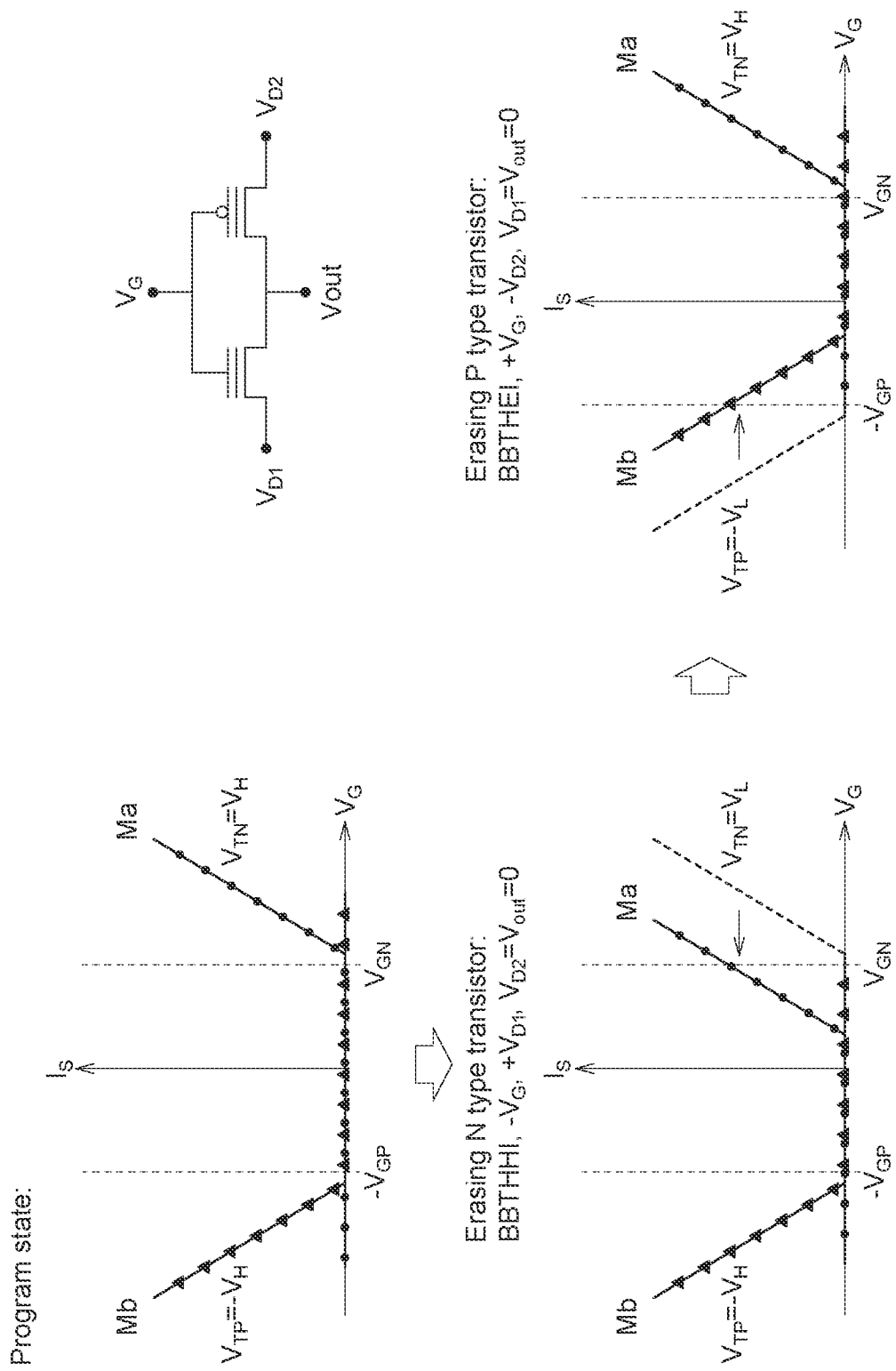
FIG. 9B shows the erase operations according to one embodiment of the application.

FIG. 9A shows the programming operations according to one embodiment of the application. FIG. 9B shows the erase operations according to one embodiment of the application.

As shown in FIG. 9A, in programming, a positive voltage $(+V_G)$ is applied to the gate voltage, a positive voltage $(+V_{D1})$ is applied to the first drain voltage, and 0V is applied to the second drain voltage and the output terminal $(V_{D2}=V_{out}=0)$ to form a Channel hot electron (CHE) effect for changing the threshold voltage $V_{TN}$ of the N type transistor (for example the first transistor Ma) from the reference threshold voltage $V_L$ into the reference threshold voltage $V_H$; and thus the N type transistor is programmed. Then, a negative voltage $(-V_G)$ is applied to the gate voltage, a negative voltage $(-V_{D2})$ is applied to the second drain voltage, and 0V is applied to the first drain voltage and the output terminal $(V_{D1}=V_{out}=0)$ to form a Channel hot hole (CHH) effect; and thus the threshold voltage $V_{TP}$ of the P type transistor (for example the second transistor Mb) is changed from the reference threshold voltage $-V_L$ into the reference threshold voltage $-V_H$; and thus the P type transistor is programmed.

As shown in FIG. 9B, in erasing, a negative voltage $(-V_G)$ is applied to the gate voltage, a positive voltage $(+V_{D1})$ is applied to the first drain voltage, and 0V is applied to the second drain voltage and the output terminal $(V_{D2}=V_{out}=0)$ to form a Band-to-Band Tunneling Hot Hole Injection (BBTHHI) effect for changing the threshold voltage $V_{TN}$ of the N type transistor (for example the first transistor Ma) from the reference threshold voltage $V_H$ into the reference threshold voltage $V_L$; and thus the N type transistor is erased. Then, a positive voltage $(+V_G)$ is applied to the gate voltage, a negative voltage $(-V_{D2})$ is applied to the second drain voltage, and 0V is applied to the first drain voltage and the output terminal $(V_{D1}=V_{out}=0)$ to form a Band to band tunneling hot electron injection (BBTHEI) effect for changing the threshold voltage $V_{TP}$ of the P type transistor (for example the second transistor Mb) from the reference threshold voltage $-V_H$ into the reference threshold voltage $-V_L$; and thus the P type transistor is erased.

Figure 10:
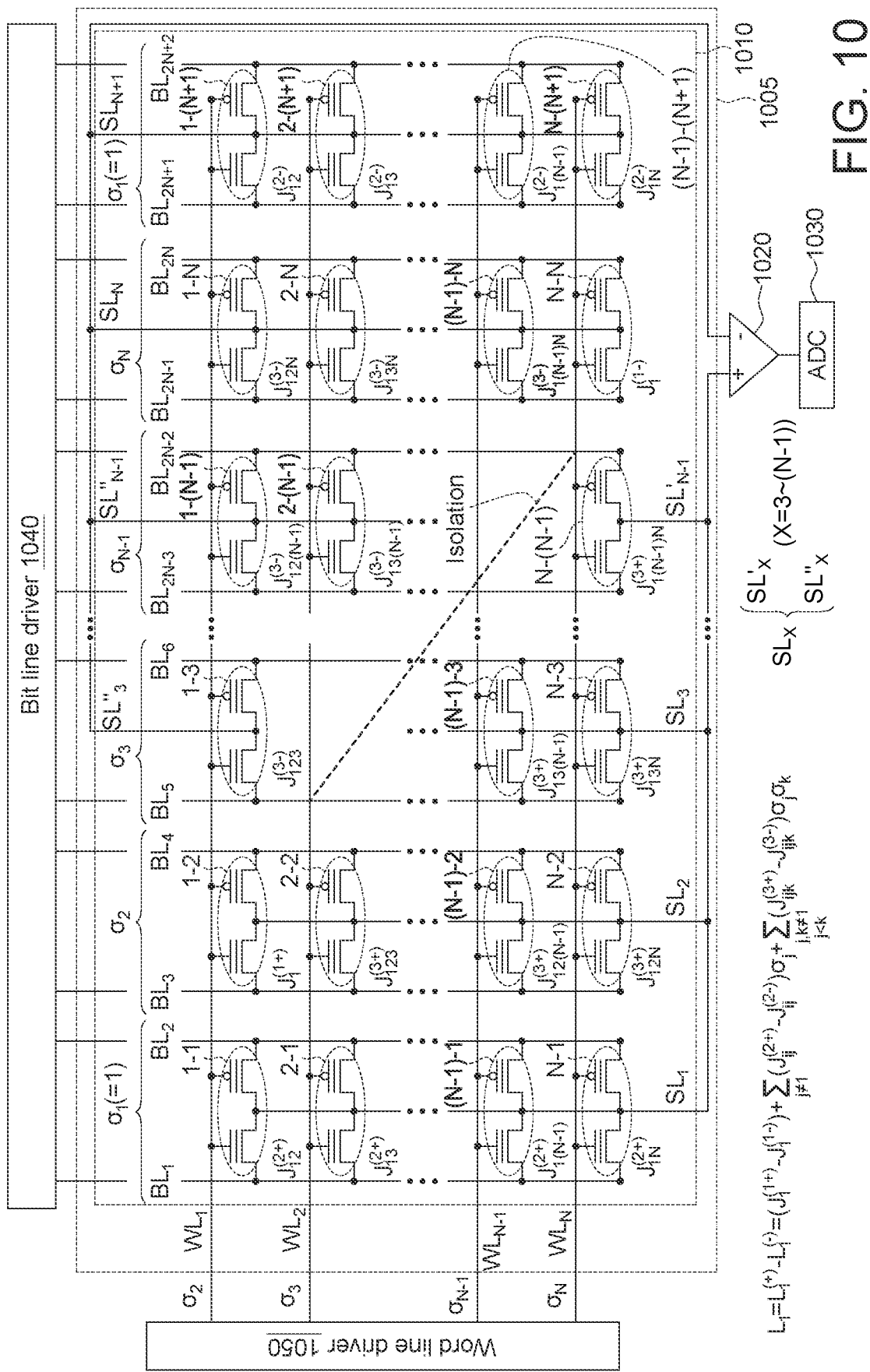
FIG. 10 shows a block diagram of a memory device according to one embodiment of the application.

FIG. 10 shows a block diagram of a memory device according to one embodiment of the application. As shown in FIG. 10, the memory device 1000 includes a memory array 1005, a calculation unit 1020, a conversion unit 1030, a bit line driver 1040 and a word line driver 1050. In here, the memory device 1000 is used in calculating the local field energy $L_1$ (in the equation (8)) which is taken as an example. One skilled in the art would understand how to calculate other first order local field energy or high order local field energy.

$$L_1 = L_1^{(+)} - L_1^{(-)} = J_1^{(1+)} - J_1^{(1-)} + \Sigma_{j\ne 1}(J_{ij}^{(2+)} - J_{ij}^{(2-)})\sigma_j + \Sigma_{j,k=1, j<k}(J_{ijk}^{(3+)} - J_{ijk}^{(3-)})\sigma_j\sigma_k \quad (8)$$

The memory array 1005 includes a memory sub-array 1010. The memory sub-array 1010 includes a plurality of memory cell 1-1~N-(N+1), a plurality of common source lines $SL_1$~$SL_{(N+1)}$ (the first signal lines), a plurality of word lines $WL_1$~$WL_N$ (the second signal lines) and a plurality of bit lines $BL_1$~$BL_{(2N+2)}$ (the third signal lines). The memory cell 1-1~N-(N+1), arranged in an array, are implemented by the memory cells 30. The common source lines $SL_1$~$SL_{(N+1)}$ are coupled to the sources of the memory cells 1-1~N-(N+1), the word lines $WL_1$~$WL_N$ are coupled to the gates of the memory cells 1-1~N-(N+1) and the bit lines $BL_1$~$BL_{(2N+2)}$ are coupled to the first drains and the second drains of the memory cells 1-1~N-(N+1). The common source lines $SL_3$~$SL_{(N-1)}$ are electrically isolated based on a diagonal such that the common source lines $SL''_3$~$SL''_{(N-1)}$ on the upper part of the memory sub-array 1010 are isolated from the common source lines $SL'_3$~$SL'_{(N-1)}$ on the lower part of the memory sub-array 1010.

The calculation unit 1020 is coupled to the memory sub-array 1010, for calculating a plurality of source currents from the memory sub-array 1010 to generate a calculation result. For example but not limited by, the calculation unit 1020 is a subtractor.

The conversion unit 1030 is coupled to the calculation unit 1020 for converting the calculation result of the calculation unit 1020 into the local field energy. For example but not limited by, the conversion unit 1030 is an analog to digital converter (ADC).

The bit line driver 1040 is coupled to the memory sub-array 1010 for driving the bit lines $BL_1$~$BL_{(2N+2)}$.

The word line driver 1050 is coupled to the memory sub-array 1010 for driving the word lines $WL_1$~$WL_N$.

As shown in FIG. 10, the word line driver 1050 outputs the gate voltages corresponding to the input values $\sigma_2$~$\sigma_N$ to the gates of the memory cells 1-1~N-(N+1), respectively. Similarly, the bit line driver 1040 outputs the drain voltages corresponding to the input values $\sigma_1$ (=logic "+1"), the input values $\sigma_2$~$\sigma_N$ and the input values $\sigma_1$ (=logic "+1") to the first drains and the second drains of the memory cells 1-1~N-(N+1), respectively.

As shown in FIG. 10, the gate voltage, the first drain voltage and the second drain voltage of the memory cell 1-2 are corresponding to the input value $\sigma_2$, and thus the memory cell 1-2 has a source current $I_S=J_1^{(1+)}$. Similarly, the gate voltage, the first drain voltage and the second drain voltage of the memory cell N-N are corresponding to the input value $\sigma_N$, and thus the memory cell N-N has a source current $I_S=J_1^{(1-)}$. Therefore, by the calculation unit 1020, the source current $I_S=J_1^{(1+)}$ of the memory cell 1-2 is subtracted by the source current $I_S=J_1^{(1-)}$ of the memory cell N-N to generate $J_1^{(1+)}-J_1^{(1-)}$.

The gate voltage of the memory cell 1-1 is corresponding to the input value $\sigma_2$, and the first drain voltage and the second drain voltage of the memory cell 1-1 are corresponding to the input value $\sigma_1$ (=logic "+1"). Thus, the memory cell 1-1 has a source current $I_S=J_{12}^{(2+)}\sigma_2$. Similarly, the gate voltage of the memory cell 2-1 is corresponding to the input value $\sigma_3$, and the first drain voltage and the second drain voltage of the memory cell 2-1 are corresponding to the input value $\sigma_1$ (=logic "+1"). Thus, the memory cell 2-1 has a source current $I_S=J_{13}^{(2+)}\sigma_3$. The current sources of the memory cells 3-1~N-1 are generated similarly. Because the common source line $SL_1$ is commonly coupled to the sources of the memory cells 1-1~N-1, the common source current on the common source line $SL_1$ is expressed as: $\Sigma_{j\neq 1}J_{1j}^{(2+)}\sigma_j$. Similarly, because the common source line $SL_{(N+1)}$ is commonly coupled to the sources of the memory cells 1-(N+1)~N-(N+1), the common source current on the common source line $SL_{(N+1)}$ is expressed as: $\Sigma_{j\neq 1}J_{1j}^{(2-)}\sigma_j$. The common source current $(=\Sigma_{j\neq 1}J_{1j}^{(2+)}\sigma_j)$ on the common source line $SL_1$ is subtracted by the common source current $(=\Sigma_{j\neq 1}J_{1j}^{(2-)}\sigma_j)$ on the common source line $SL_{(N+1)}$ to calculate $\Sigma_{j\neq 1}J_{ij}^{(2+)}-J_{ij}^{(2-)}\sigma_j$.

Similarly, the gate voltage of the memory cell 2-2 is corresponding to the input value $\sigma_3$, and the first drain voltage and the second drain voltage of the memory cell 2-2 are corresponding to the input value $\sigma_2$. Thus, the memory cell 2-2 has a source current $I_S=J_{123}^{(3+)}\sigma_2\sigma_3$. Similarly, the gate voltage of the memory cell N-2 is corresponding to the input value $\sigma_N$, and the first drain voltage and the second drain voltage of the memory cell N-2 are corresponding to the input value $\sigma_2$. Thus, the memory cell N-2 has a source current $I_S=J_{12N}^{(3+)}\sigma_2\sigma_N$. The current sources of the memory cells 3-2~(N-1)-2 are generated similarly. Because the common source line $SL_2$ is commonly coupled to the sources of the memory cells 2-2~N-2, the common source current on the common source line $SL_2$ is expressed as: $\Sigma_k J_{12k}^{(3+)}\sigma_j\sigma_k$. Similarly, because the common source line $SL_N$ is commonly coupled to the sources of the memory cells 1-N~(N-1)-N, the common source current on the common source line $SL_N$ is expressed as: $\Sigma_{k\neq 1}J_{12k}^{(3-)}\sigma_j\sigma_k$. The common source current $(=\Sigma_{k\neq 1}J_{12k}^{(3+)}\sigma_j\sigma_k)$ on the common source line $SL_2$ is subtracted by the common source current $(=\Sigma_{k\neq 1}J_{12k}^{(3-)}\sigma_j\sigma_k)$ on the common source line $SL_N$ to calculate $\Sigma_{k\neq 1}J_{12k}^{(3+)}-J_{12k}^{(3-)}\sigma_j\sigma_k$.

By so, the common source currents on the common source lines $SL_1$~$SL_{(N+1)}$ are calculated.

Because the common source currents on the common source lines $SL_1$~$SL_{(N+1)}$ are input into the calculation unit 1020, the calculation unit 1020 calculates the local field energy $L_1$ as: $L_1=L_1^{(+)}-L_1^{(-)}=J_1^{(1+)}-J_1^{(1-)}+\Sigma_{j\neq 1}(J_{ij}^{(2+)}-J_{ij}^{(2-)})\sigma_j+\Sigma_{j,k\neq 1,j<k}(J_{ijk}^{(3+)}-J_{ijk}^{(3-)})\sigma_j\sigma_k)$.

The conversion unit 1030 may further convert the local field energy $L_1$ into a digital signal.

In FIG. 10, the memory sub-array 1010 may be regarded as having two parts, a first part for storing first part coefficients $J^{(+)}(J_1^{(1+)}, J_{12}^{(2+)}, \ldots)$ of the interact coefficient J while a second part for storing second part coefficients $J^{(-)}(J_1^{(1-)}, J_{12}^{(2-)}, \ldots)$ of the interact coefficient J. By so, the full range of the interact coefficient J are generated. As described above, by the erase operations or the programming operations, the threshold voltages of the N type transistor and the P type transistor are changed to change the first part coefficients $J^{(+)}$ and the second part coefficients $J^{(-)}$ of the interact coefficient J.

A first part of the memory sub-array 1010 is for calculating a first part local field energy Lim of the local field energy $L_1$ while a second part of the memory sub-array 1010 is for calculating a second part local field energy $L_1^{(-)}$ of the local field energy $L_1$ to generate the local field energy $L_1$ as $L_1=L_1^{(+)}+L_1^{(-)}$.

Further, in FIG. 10, the first part of the memory sub-array 1010 is electrically isolated from the second part of the memory sub-array 1010.

Figure 11:
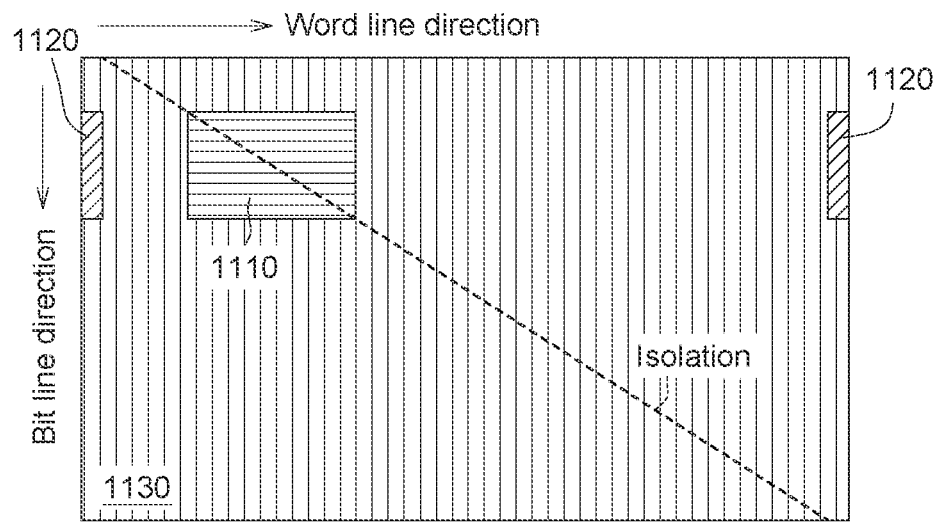
FIG. 11 shows a circuit diagram of a memory device according to one embodiment of the application.

FIG. 11 shows a circuit diagram of a memory device according to one embodiment of the application. In FIG. 11, the memory device 1100 has a memory array including: a first memory sub-array 1110, a second memory sub-array 1120 and a third memory sub-array 1130. The first memory sub-array 1110 and the second memory sub-array 1120 are substantially equivalent to the memory sub-array 1010 of the memory device 1000 in FIG. 10. Of course, the memory device 1100 may further include: a calculation unit, a conversion unit, a bit line driver, a word line driver and so on.

The first memory sub-array 1110 is for storing the first order coefficients $J_1^{(1)}(=J_1^{(1+)}+J_1^{(1-)})$ and the third order coefficients $J_3^{(3)}(=J_3^{(3+)}+J_3^{(3-)})$. That is, the first memory sub-array 1110 is for storing a plurality of odd order interact coefficients. The first memory sub-array 1110 is substantially equivalent to the memory cells 1-2~1-N, 2-2~2-N, ..., N-2~N-N in FIG. 10. The first memory sub-array 1110 is on the diagonal position of the memory array.

The second memory sub-array 1120 is for storing the second order coefficients $J_2^{(2)}(=J_2^{(2+)}+J_2^{(2-)})$. That is, the second memory sub-array 1120 is for storing a plurality of even order interact coefficients. The second memory sub-array 1120 is substantially equivalent to the memory cells 1-1~N-1 and 1-(N+1)~N-(N+1). The second memory sub-array 1120 is on the two sides of the memory array.

The plurality of memory cells of the third memory sub-array 1130 are programmed as the N type transistors and the P type transistors having high threshold voltages ($V_H$ and $-V_H$). That is, in normal operations, the plurality of memory cells of the third memory sub-array 1130 are turned off.

The memory device 1100 in FIG. 11 has an advantage of array scalability, that is, mapping coefficients of a low spin-count with a small partition in a large array.

Figure 12:
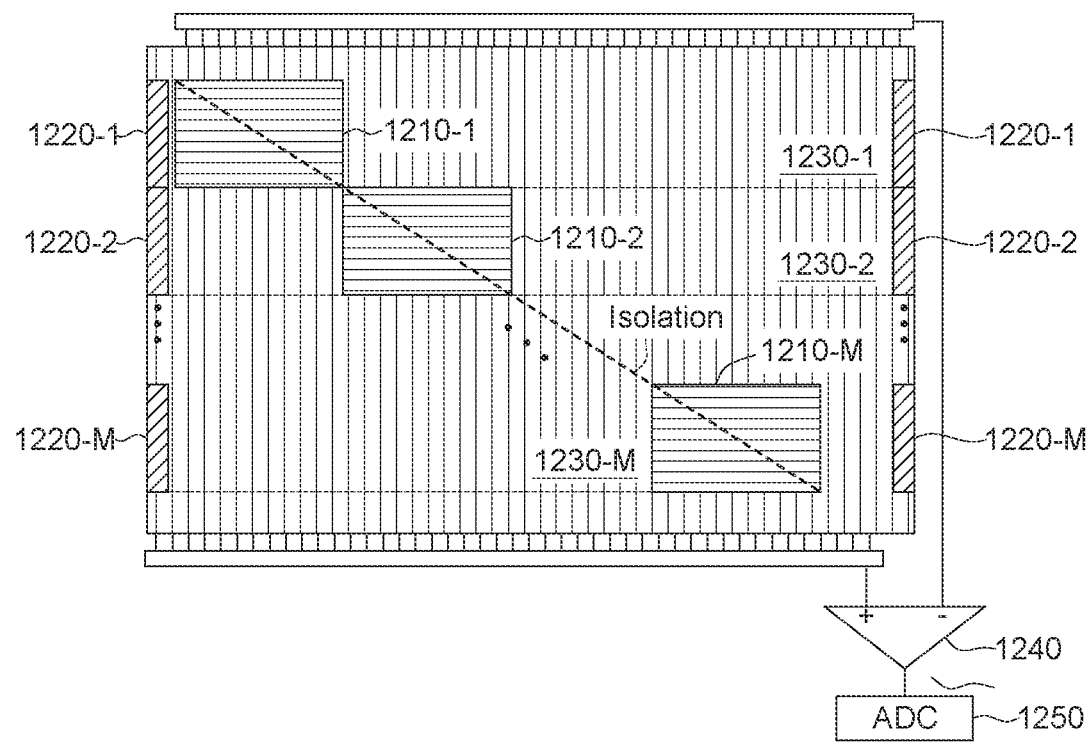
FIG. 12 shows a circuit diagram of a memory device according to one embodiment of the application.

FIG. 12 shows a circuit diagram of a memory device according to one embodiment of the application. In FIG. 12, the memory device 1200 includes: a plurality of first memory sub-arrays 1210-1~1210-M, a plurality of second memory sub-arrays 1220-1~1220-M and a plurality of third memory sub-arrays 1230-1~1230-M. The first memory sub-array 1210-1, the second memory sub-array 1220-1 and the third memory sub-array 1230-1 are of the first group, the first memory sub-array 1210-2, the second memory sub-array 1220-2 and the third memory sub-array 1230-2 are of the second group. Others are so on. The first memory sub-array 1210-M, the second memory sub-array 1220-M and the third memory sub-array 1230-M are of the M-th group.

Of course, the memory device 1200 may further include a calculation unit 1240, a conversion unit 1250, a bit line driver, and a word line driver and so on.

Each of the first memory sub-arrays 1210-1~1210-M is for storing the first order coefficients $J_1^{(1)}(=J_1^{(1+)}+J_1^{(1-)})$ and the third order coefficients $J_3^{(3)}(=J_3^{(3+)}+J_3^{(3-)})$. That is, the first memory sub-arrays 1210-1~1210-M are for storing a plurality of odd order interact coefficients. The first memory sub-arrays 1210-1~1210-M are substantially equivalent to the first memory sub-array 1110 in FIG. 10. The first memory sub-arrays 1210-1~1210-M are on the diagonal position of the memory array.

Each of the second memory sub-arrays 1220-1~1220-M is for storing the second order coefficients $J_2^{(2)}(=J_2^{(2+)}+J_2^{(2-)})$. That is, the second memory sub-arrays 1220-1~1220-M are for storing a plurality of even order interact coefficients. The second memory sub-arrays 1220-1~1220-M are substantially equivalent to the second memory sub-array 1120 in FIG. 11. The second memory sub-arrays 1220-1~1220-M are on the two sides of the memory array.

The plurality of memory cells of the third memory sub-arrays 1230-1~1230-M are substantially equivalent to the third memory sub-array 1130 in FIG. 11. In normal operations, the plurality of memory cells of the third memory sub-arrays 1230-1-1230-M are turned off.

In FIG. 12, in calculation, the first group to the M-th group independently calculate the local field energy group by group. That is, one group is allowed to calculate the local field energy. The input values are input into the selected group, but not into the unselected groups.

The word lines corresponding to the unselected groups are grounded (0V) and the bit lines corresponding to the unselected groups are floated or grounded.

The memory device 1200 of FIG. 12 is an extension version of the memory device 1100 of FIG. 11.

Figure 13:
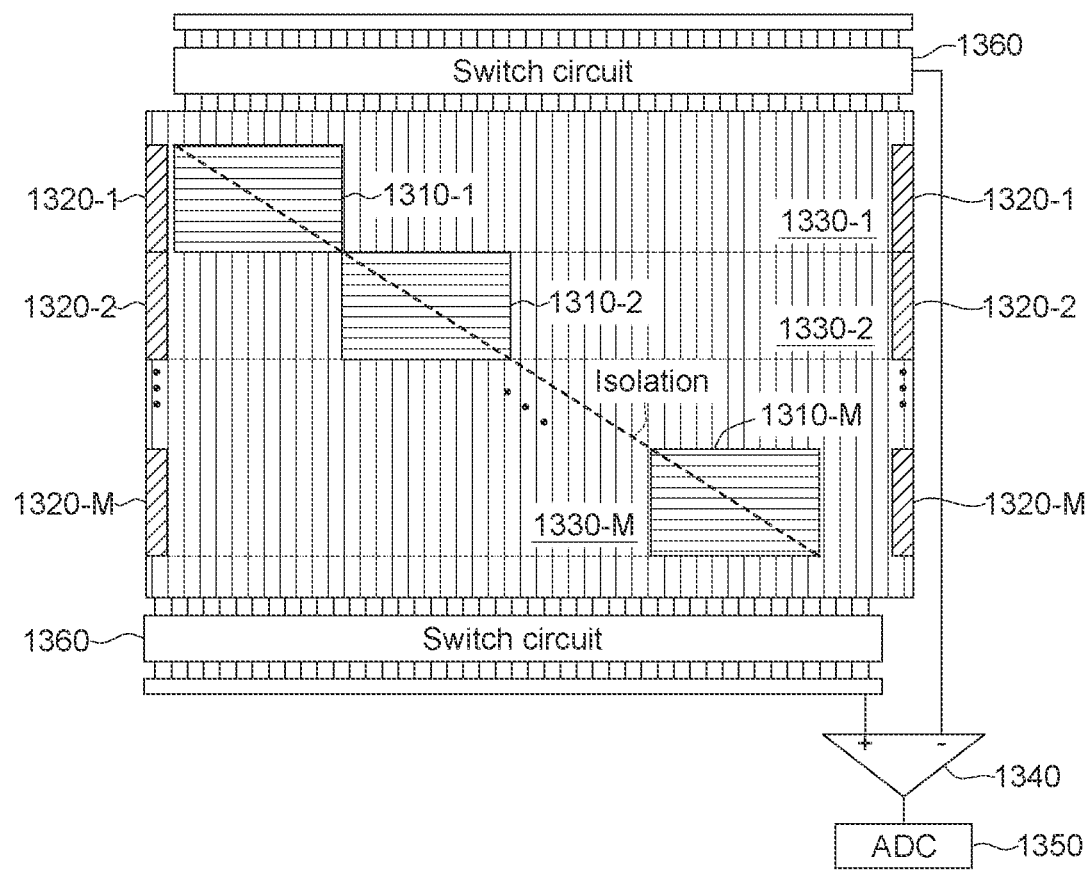
FIG. 13 shows a circuit diagram of a memory device according to one embodiment of the application.

FIG. 13 shows a circuit diagram of a memory device according to one embodiment of the application. In FIG. 13, the memory device 1300 includes: a plurality of first memory sub-arrays 1310-1~1310-M, a plurality of second memory sub-arrays 1320-1~1320-M and a plurality of third memory sub-arrays 1330-1~1330-M. Of course, the memory device 1300 may further include a calculation unit 1340, a conversion unit 1350, a bit line driver, and a word line driver and so on. Further, the memory device 1300 includes: a switch circuit 1360 coupled to the common source lines.

The first memory sub-arrays 1310-1~1310-M, the second memory sub-arrays 1320-1~1320-M, the third memory sub-arrays 1330-1~1330-M, the calculation unit 1340, the conversion unit 1350 are similar to the above description and thus are not repeated here.

In FIG. 13, the input values are input into all groups while the switch circuit 1360 selects the common source lines to select which one of the groups to calculate the local field energy. Similarly, one group is selected in one time to calculate the local field energy.

Figure 14:
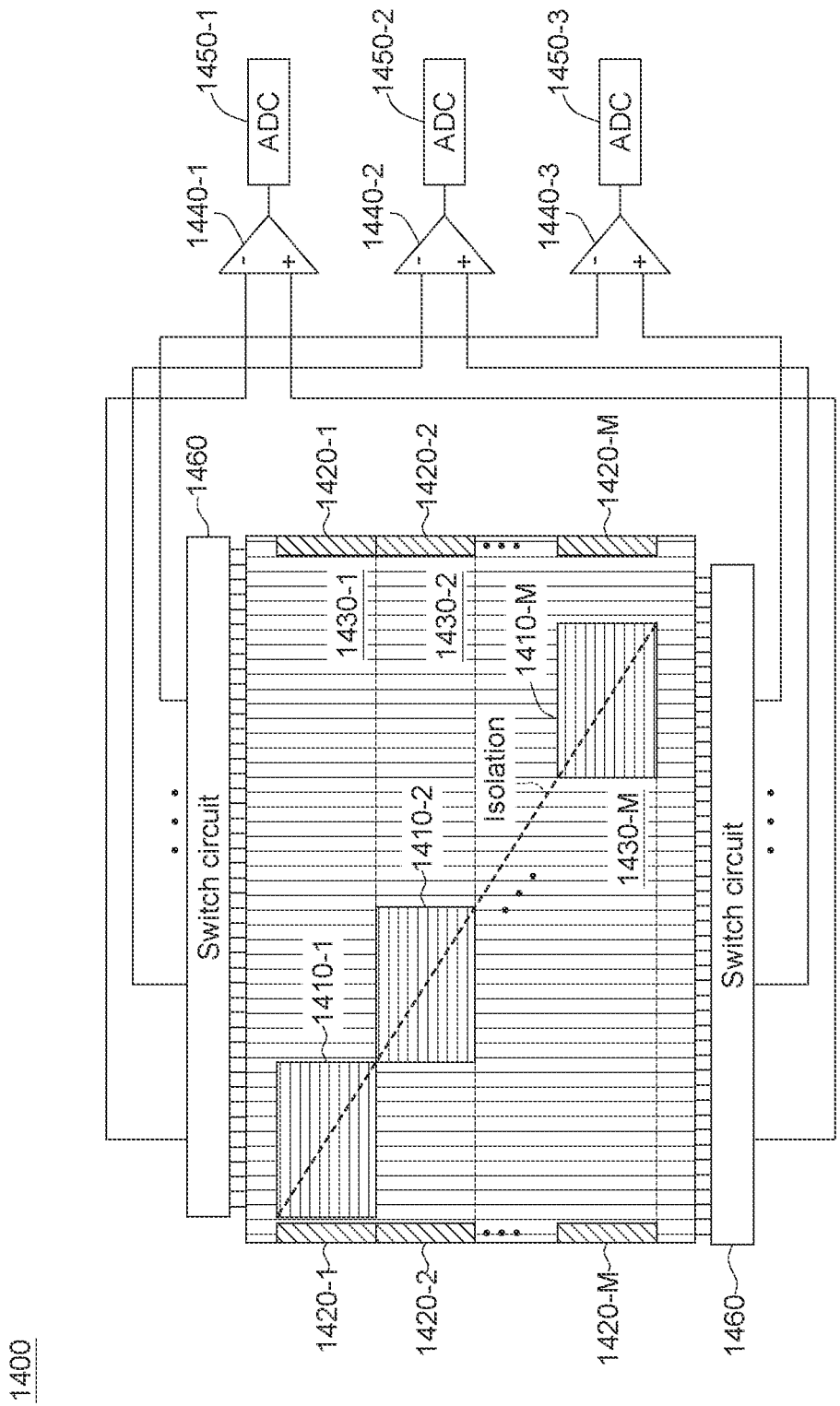
FIG. 14 shows a circuit diagram of a memory device according to one embodiment of the application.

FIG. 14 shows a circuit diagram of a memory device according to one embodiment of the application. In FIG. 14, the memory device 1400 includes: a plurality of first memory sub-arrays 1410-1~1410-M, a plurality of second memory sub-arrays 1420-1~1420-M and a plurality of third memory sub-arrays 1430-1~1430-M. Of course, the memory device 1400 may further include a plurality of calculation units 1440-1~1440-3, a plurality of conversion units 1450-1~1450-3, a bit line driver, a word line driver and so on. Further, the memory device 1400 includes: a switch circuit 1460 coupled to the common source lines.

The first memory sub-arrays 1410-1~1410-M, the second memory sub-arrays 1420-1~1420-M, the third memory sub-arrays 1430-1~1430-M, the calculation units 1440-1~1440-3 and the conversion units 1450-1~1450-3 are similar to the above description and thus are not repeated here.

In FIG. 14, the switch circuit 1460 selects the common source lines for selecting one or more groups for outputting the local field energy. As shown in FIG. 14, because there are three calculation units 1440-1~1440-3 and three conversion units 1450-1~1450-3, at most three groups are selected in one time to output the local field energy.

In the above embodiments, the N type transistor and the P type transistor of the memory cell 30 are for example but not limited by, floating gate devices, Silicon-Oxide-Nitride-Oxide-Silicon (SONOS) thin film transistors, ferroelectric field effect transistors (FeFET) and so on.

Figure 15B:
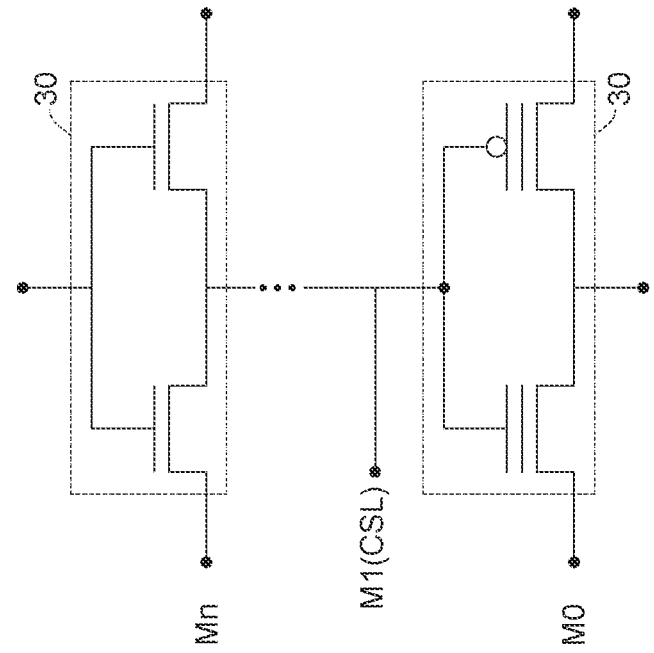
FIG. 15A and FIG. 15B show cascade of the memory cells according to one embodiment of the application.
Figure 15A:
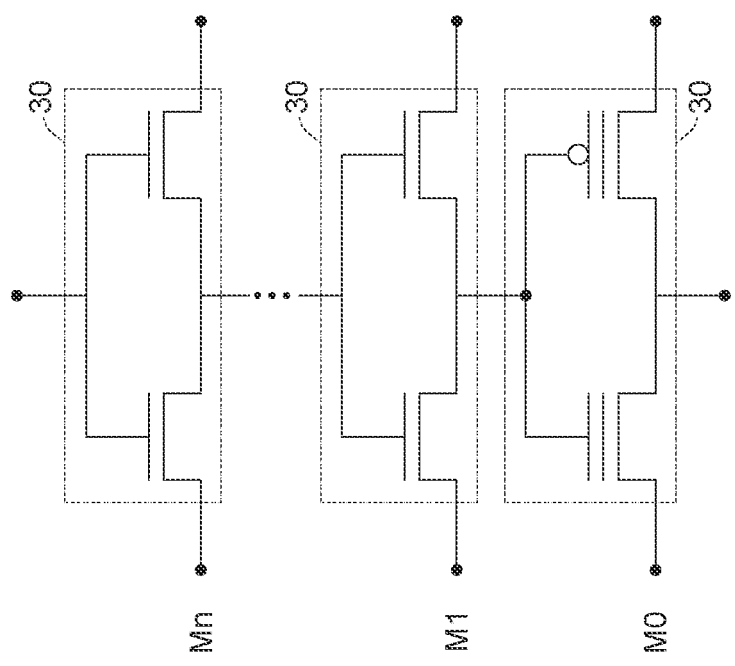

FIG. 15A and FIG. 15B show cascade of the memory cells according to one embodiment of the application. As shown in FIG. 15A, by three dimension integration, the memory cells on different metal layers M0, M1, . . . Mn are cascaded.

As shown in FIG. 15B, in cascading the memory cells, by three dimension integration, a control signal line (CSL) is inserted between different metal layers (M0, Mn) for effective programming and erasing, wherein the memory cell on the upper metal layer (Mn) is free of programming and erasing.

Figure 16:
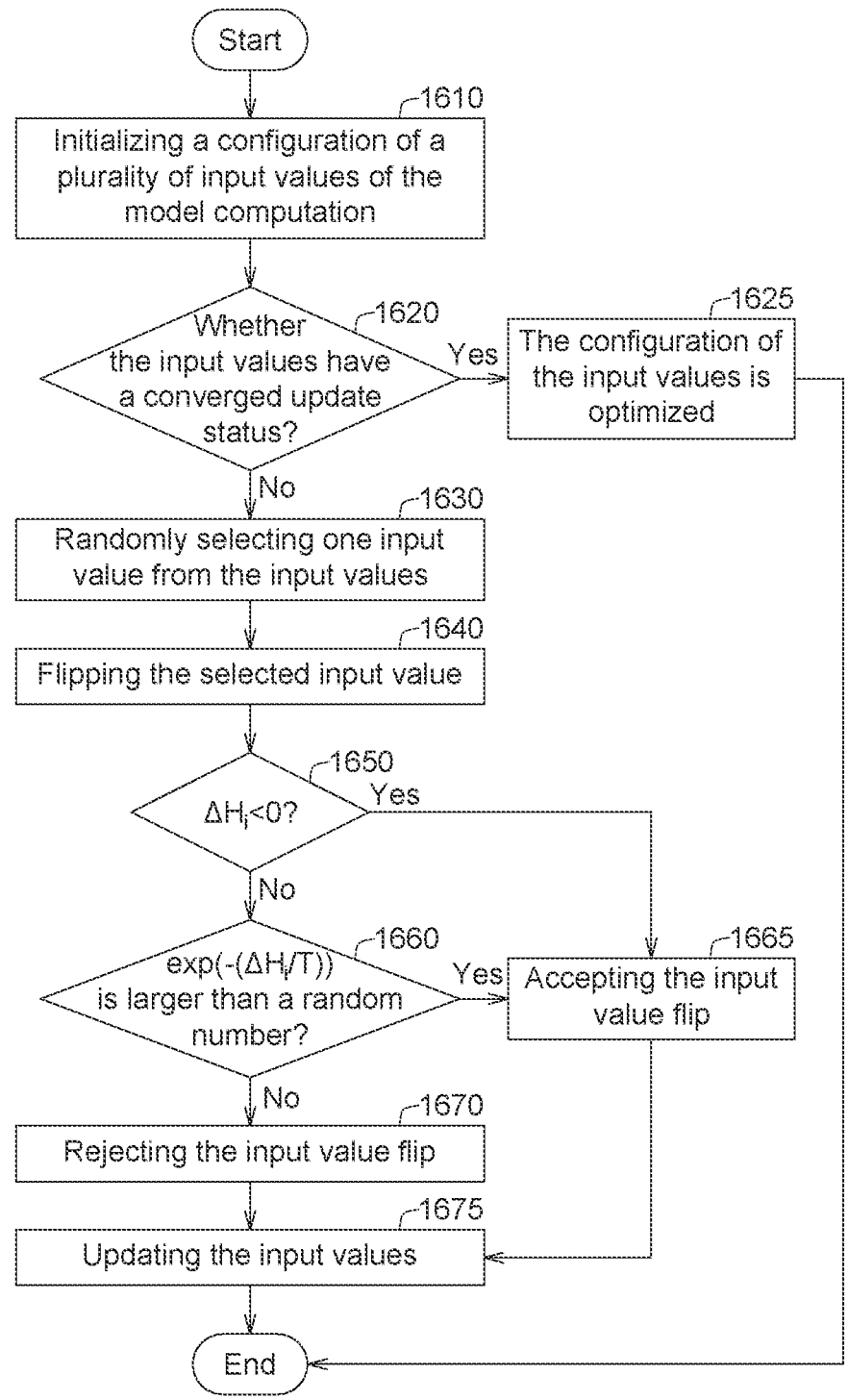
FIG. 16 shows an operation method for a memory device according to one embodiment of the application.

FIG. 16 shows an operation method for a memory device according to one embodiment of the application. The operation method is applicable to the above memory devices. In step 1610, a configuration of a plurality of input values ($\sigma_1$ . . . ) of the model computation is initialized. In step 1620, it is determined whether the input values have a converged update status. If converged, then the configuration of the input values is optimized (step 1625), and the operation method is completed. If not converged yet, the step 1630 is performed to randomly select one input value from the input values.

In step 1640, the selected input value is flipped. In step 1650, it is determined an energy difference ($\Delta H_i$) corresponding to the selected input value is smaller than 0. If the energy difference ($\Delta H_i$) is smaller than 0, then the input value flip is accepted (step 1665). If the energy difference ($\Delta H_i$) is not smaller than 0, in step 1660, it is determined whether $\exp(-(\Delta H_i/T))$ is larger than a random number (the random number is between 0~1), wherein the parameter T refers to temperature.

If the step 1660 is yes, then the flow proceeds to step 1665. If the step 1660 is no, then the flow proceeds to step 1670 to reject the input value flip. In step 1675, the input values are updated.

Figure 17:
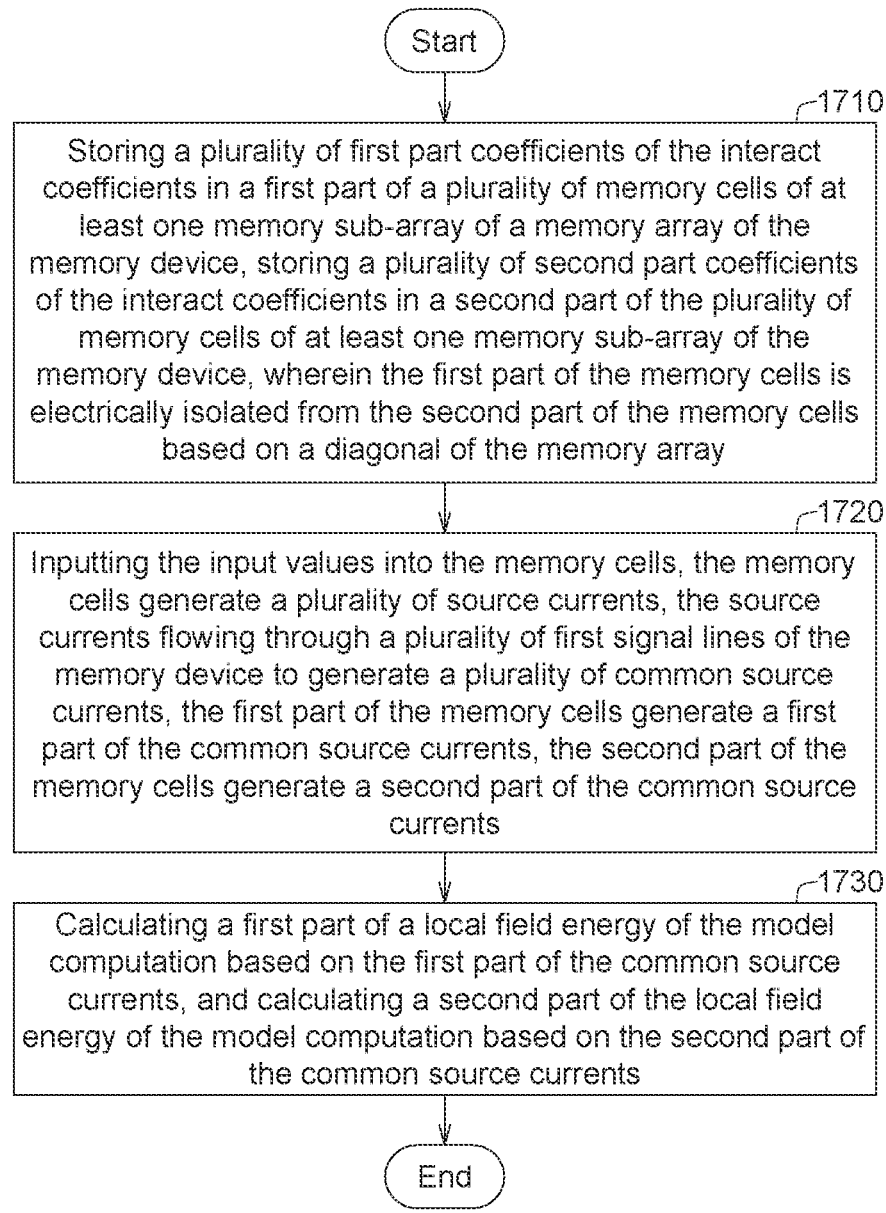
FIG. 17 shows an operation method of a memory device according to one embodiment of the application.

FIG. 17 shows an operation method of a memory device according to one embodiment of the application. The operation method is applicable to the above memory devices. The operation method is for processing a model computation, the model computation having a plurality of input values and a plurality of interact coefficients. The operation method includes: storing a plurality of first part coefficients of the interact coefficients in a first part of a plurality of memory cells of at least one memory sub-array of a memory array of the memory device, storing a plurality of second part coefficients of the interact coefficients in a second part of the plurality of memory cells of at least one memory sub-array of the memory device, wherein the first part of the memory cells is electrically isolated from the second part of the memory cells based on a diagonal of the memory array (1710); inputting the input values into the memory cells, the memory cells generate a plurality of source currents, the source currents flowing through a plurality of first signal lines of the memory device to generate a plurality of common source currents, the first part of the memory cells generate a first part of the common source currents, the second part of the memory cells generate a second part of the common source currents (1720); and calculating a first part of a local field energy of the model computation based on the first part of the common source currents, and calculating a second part of the local field energy of the model computation based on the second part of the common source currents (1730).

The above embodiments use hardware designs to rapidly execute complex model computations, which may result in less time-consuming, less energy-consuming. When the dimension of the Ising model is larger and has a larger amount of spin states, the above embodiments may still rapidly complete computation.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
   a memory array, for processing model computation having a plurality of input values and a plurality of interact coefficients, the memory array including at least one memory sub-array, the at least one memory sub-array including: a plurality of memory cells, a plurality of first signal lines, a plurality of second signal lines and a plurality of third signal lines coupled to the memory cells; and
   at least one calculation unit, coupled to the at least one memory sub-array,
   wherein,
   the plurality of memory cells receive the plurality of input values via the plurality of second signal lines and the plurality of third signal lines, the plurality of memory cells generate a plurality of source currents, the plurality of source currents flowing through the plurality of first signal lines to generate a plurality of common source currents, the plurality of common source currents flowing into the at least one calculation unit, a first part of the plurality of memory cells generate a first part of the plurality of common source currents, a second part of the plurality of memory cells generate a second part of the plurality of common source currents;
   the first part of the plurality of memory cells store a plurality of first part coefficients of the plurality of interact coefficients, and the second part of the plurality of memory cells store a plurality of second part coefficients of the plurality of interact coefficients, wherein the first part of the plurality of memory cells is electrically isolated from the second part of the plurality of memory cells based on a diagonal of the memory array; and
   the at least one calculation unit calculates a first part of a local field energy of the model computation based on the first part of the plurality of common source currents, and calculates a second part of the local field energy of the model computation based on the second part of the plurality of common source currents.

2. The memory device according to claim 1, wherein the at least one memory sub-array includes:
   a first memory sub-array, the first memory sub-array being for storing a plurality of odd order interact coefficients, the first memory sub-array being on a diagonal position of the memory array;
   a second memory sub-array, the second memory sub-array being for storing a plurality of even order interact coefficients, the second memory sub-array being on two sides of the memory array; and
   a third memory sub-array, the third memory sub-array being turned off in normal operations.

3. The memory device according to claim 1, wherein the at least one memory sub-array includes:
   a plurality of first memory sub-arrays for storing a plurality of odd order interact coefficients, the plurality of first memory sub-arrays being on a diagonal position of the memory array;
   a plurality of second memory sub-arrays for storing a plurality of even order interact coefficients, the plurality of second memory sub-arrays being on two sides of the memory array; and
   a plurality of third memory sub-arrays, the plurality of third memory sub-arrays being turned off in normal operations;
   the plurality of first memory sub-arrays, the plurality of second memory sub-arrays and the plurality of third memory sub-arrays form a plurality of groups;
   in calculation, the plurality of groups independently calculate and one among the plurality of groups are selected to calculate the local field energy of the model computation, the plurality of input values are input into the selected group but not into the unselected groups.

4. The memory device according to claim 1, wherein the at least one memory sub-array includes:
   a plurality of first memory sub-arrays for storing a plurality of odd order interact coefficients, the plurality of first memory sub-arrays being on a diagonal position of the memory array;
   a plurality of second memory sub-arrays for storing a plurality of even order interact coefficients, the plurality of second memory sub-arrays being on two sides of the memory array; and
   a plurality of third memory sub-arrays, the plurality of third memory sub-arrays being turned off in normal operations;

the plurality of first memory sub-arrays, the plurality of second memory sub-arrays and the plurality of third memory sub-arrays form a plurality of groups;

in calculation, the plurality of groups independently calculate;

wherein the memory device further includes a switch circuit coupled between the plurality of first signal lines and the plurality of groups;

the plurality of input values are input into all the plurality of groups;

the switch circuit select at least one among the plurality of groups to output the local field energy of the model computation.

5. The memory device according to claim 4, wherein the memory device includes a plurality of calculation units coupled to the plurality of first signal lines, the switch circuit selects two or more among the plurality of groups to output the local field energy of the model computation.

6. An operation method for a memory device, for processing a model computation, the model computation having a plurality of input values and a plurality of interact coefficients, the operation method including:

storing a plurality of first part coefficients of the plurality of interact coefficients in a first part of a plurality of memory cells of at least one memory sub-array of a memory array of the memory device, storing a plurality of second part coefficients of the plurality of interact coefficients in a second part of the plurality of memory cells of the at least one memory sub-array of the memory device, wherein the first part of the plurality of memory cells is electrically isolated from the second part of the plurality of memory cells based on a diagonal of the memory array;

inputting the plurality of input values into the plurality of memory cells, the plurality of memory cells generate a plurality of source currents, the plurality of source currents flowing through a plurality of first signal lines of the memory device to generate a plurality of common source currents, the first part of the plurality of memory cells generate a first part of the plurality of common source currents, the second part of the plurality of memory cells generate a second part of the plurality of common source currents; and calculating a first part of a local field energy of the model computation based on the first part of the plurality of common source currents, and calculating a second part of the local field energy of the model computation based on the second part of the plurality of common source currents.

7. The operation method according to claim 6, wherein the at least one memory sub-array includes: a first memory sub-array, a second memory sub-array and a third memory sub-array, wherein the operation method further includes:

storing a plurality of odd order interact coefficients in the first memory sub-array, the first memory sub-array being on a diagonal position of the memory array;

storing a plurality of even order interact coefficients in the second memory sub-array, the second memory sub-array being on two sides of the memory array; and turned off the third memory sub-array in normal operations.

8. The operation method according to claim 6, wherein the at least one memory sub-array includes: a plurality of first memory sub-arrays, a plurality of second memory sub-arrays and a plurality of third memory sub-arrays;

wherein the operation method further includes:

storing a plurality of odd order interact coefficients in the plurality of first memory sub-arrays, the plurality of first memory sub-arrays being on a diagonal position of the memory array;

storing a plurality of even order interact coefficients in the plurality of second memory sub-arrays, the plurality of second memory sub-arrays being on two sides of the memory array; and turned off the plurality of third memory sub-arrays in normal operations;

the plurality of first memory sub-arrays, the plurality of second memory sub-arrays and the plurality of third memory sub-arrays form a plurality of groups;

in calculation, the plurality of groups independently calculate;

selecting one among the plurality of groups to calculate the local field energy of the model computation, the plurality of input values are input into the selected group but not into the unselected groups.

9. The operation method according to claim 6, wherein the at least one memory sub-array includes: a plurality of first memory sub-arrays, a plurality of second memory sub-arrays and a plurality of third memory sub-arrays;

wherein the operation method further includes:

storing a plurality of odd order interact coefficients in the plurality of first memory sub-arrays, the plurality of first memory sub-arrays being on a diagonal position of the memory array;

storing a plurality of even order interact coefficients in the plurality of second memory sub-arrays, the plurality of second memory sub-arrays being on two sides of the memory array; and turned off the plurality of third memory sub-arrays in normal operations;

the plurality of first memory sub-arrays, the plurality of second memory sub-arrays and the plurality of third memory sub-arrays form a plurality of groups;

in calculation, the plurality of groups independently calculate; and wherein the memory device further includes a switch circuit, the plurality of input values are input into all the plurality of groups, and the switch circuit selects at least one among the plurality of groups to output the local field energy of the model computation.

10. The operation method according to claim 9, wherein the memory device includes a plurality of calculation units coupled to the plurality of first signal lines, the switch circuit selects two or more among the plurality of groups to output the local field energy of the model computation.

* * * * *